United States Patent
Cordaro et al.

(10) Patent No.: US 11,467,495 B2
(45) Date of Patent: Oct. 11, 2022

(54) BROADBAND, POLARIZATION-INDEPENDENT, OMNIDIRECTIONAL, METAMATERIAL-BASED ANTIREFLECTION COATING

(71) Applicant: The Board of Trustees of the Leland Stanford Junior University, Stanford, CA (US)

(72) Inventors: Concetto Eugenio Andrea Cordaro, Piazza Armerina (IT); Emanuele Francesco Pecora, Alexandria, VA (US); Mark L. Brongersma, Menlo Park, CA (US); Jorik van de Groep, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 192 days.

(21) Appl. No.: 16/496,486

(22) PCT Filed: Mar. 28, 2018

(86) PCT No.: PCT/US2018/024003
§ 371 (c)(1),
(2) Date: Sep. 23, 2019

(87) PCT Pub. No.: WO2018/175874
PCT Pub. Date: Sep. 27, 2018

(65) Prior Publication Data
US 2020/0379349 A1    Dec. 3, 2020

(51) Int. Cl.
*G03F 7/09*    (2006.01)
*G02B 1/118*    (2015.01)
(Continued)

(52) U.S. Cl.
CPC .............. *G03F 7/091* (2013.01); *G02B 1/118* (2013.01); *G03F 7/0002* (2013.01); *G03F 7/2002* (2013.01); *G03F 7/2037* (2013.01)

(58) Field of Classification Search
CPC ................................. G03F 7/091; G02B 1/118
See application file for complete search history.

(56) References Cited

U.S. PATENT DOCUMENTS 9,190,542 B1    11/2015  Brener
11,281,109 B2 *  3/2022  Singh .................... G03F 7/7015
(Continued)

OTHER PUBLICATIONS

Spinelli et al., "Broadband omnidirectional antireflection coating based on subwavelength surface Mie resonators", 2012, Nature Communications I 3:692.

*Primary Examiner* — Amanda C. Walke
(74) *Attorney, Agent, or Firm* — Lumen Patent Firm

(57) ABSTRACT

To address the needs in the art, a method of fabricating a meta-surface antireflective coating that includes forming on a substrate or in a film on the substrate, using a patterning method, a pattern of nanostructures, where the nanostructures include a pattern of nanowires or a pattern of nanoparticles, or the pattern nanowires and the pattern of nanoparticles, where the nanostructures are arranged to form a metasurface AR coating, where the metasurface AR coating reflects incident light in a double-dip reflectance according to a doubly-resonant arrangement of the metasurface AR coating, where the metasurface AR coating comprises a structure for a direct light pathway and a resonant light pathway.

15 Claims, 14 Drawing Sheets

(51) Int. Cl.
   *G03F 7/00*      (2006.01)
   *G03F 7/20*      (2006.01)

(56)         References Cited

U.S. PATENT DOCUMENTS

2011/0284723  A1*  11/2011  Cao ..................... H01L 31/0543
                                                                 250/208.2
2013/0149860  A1*   6/2013  Dasgupta .......... H01L 31/02168
                                                                  977/932
2015/0040978  A1*   2/2015  Shalaev .............. H01L 31/0543
                                                                  136/256
2018/0217395  A1*   8/2018  Lin ......................... G02B 1/111
2022/0020963  A1*   1/2022  Lee ..................... H01L 51/5268

* cited by examiner

BROADBAND, POLARIZATION-INDEPENDENT, OMNIDIRECTIONAL, METAMATERIAL-BASED ANTIREFLECTION COATING

CROSS-REFERENCE TO RELATED APPLICATIONS

This application is a 371 of PCT application PCT/US2018/024003 filed Mar. 23, 2018. PCT application PCT/US2018/024003 claims the benefit of U.S. Provisional application 62/475,582 filed Mar. 23, 2017.

FIELD OF THE INVENTION

The invention relates to anti-reflective coating. More specifically, the invention relates to a method of forming an anti-reflective coating having combined Mie and Fabry-Pérot resonances.

BACKGROUND OF THE INVENTION

The quest for more efficient photonic devices relies on the ability to mold and manage the flow of light at the nanoscale. In particular, one ubiquitous problem in optoelectronics devices is reducing the reflection of a certain substrate to maximize light in-coupling. Indeed, when light impinges on an interface between two optical media with different refractive indices it is partially reflected. For many applications, this partial reflection is an unwanted (loss) process and many strategies have been developed to avoid this phenomenon. For photovoltaic (PV) applications, in particular, the requirement to minimize reflection losses is stringent as reflection directly diminishes the power conversion efficiency.

The minimization of reflection of a flat substrate was first demonstrated by placing a thin layer of transparent dielectric—referred to as Rayleigh's film—at the interface of the substrate to suppress reflection by destructive interference. If the refractive index of the film ($n_f$) is equal to the geometric mean of the index of the substrate ($n_{sub}$) and medium ($n_m$) above $n_f = \sqrt{n_m n_{sub}}$, the back-reflection is completely eliminated for light with wavelength $\lambda$=4nd, where d is the film thickness. In PV applications, the most commonly used material for such anti reflection coatings (ARC) is $Si_3N_4$, given its near-ideal index to eliminate reflection off the Si-air interface. However, a major disadvantage of such single-layer interference coatings lies in the strong dependence on both the angle of incidence (AOI) and the wavelength of the incident light. Further evolutions of the interference AR concept include multiple or graded-index coatings, achieving broadband and omnidirectional AR at the expense of ease of fabrication and costs.

Some proposed approaches exploit high-index resonant scatterers and optical metasurfaces to achieve broadband anti-reflection with thin and efficient nanostructured patterns. Intuitively, when a high index dielectric nanostructure has dimensions comparable to the wavelength of incident light in the medium, light can be trapped inside the nanostructure upon excitation of Mie resonances. The large scattering cross section of such optical resonances enables efficient light trapping and allows for the excitation of resonant modes that are well coupled to high-index substrates. This enables strong forward scattering of the incident light into the substrate, and thereby low reflectance. Nonetheless, the spectral efficiency of these nanopatterns is limited by their resonance bandwidth so a multi-resonant behavior is needed in order to cover the majority of the solar spectrum.

What is needed is a multi-resonant metasurface for high-index materials in broadband wavelength ranges.

SUMMARY OF THE INVENTION

To address the needs in the art, a method of fabricating a meta-surface antireflective coating that includes forming on a substrate or in a film on the substrate, using a patterning method, a pattern of nanostructures, where the nanostructures include a pattern of nanowires or a pattern of nanoparticles, or the pattern nanowires and the pattern of nanoparticles, where the nanostructures are arranged to form a metasurface AR coating, where the metasurface AR coating reflects incident light in a double-dip reflectance according to a doubly-resonant arrangement of the metasurface AR coating, where the metasurface AR coating comprises a structure for a direct light pathway and a resonant light pathway.

In one aspect of the invention, the substrate can include Si, Ge, GaAs, copper indium gallium (di)selenide (CIGS), CdTe, InP, GaN, GaP, or $TiO_2$.

In another aspect of the invention, the film on the substrate can include dielectrics or semiconductors, where the dielectrics can include silicon nitride, titanium dioxide, transparent oxides such as ITO or ZnO, glasses such as $SiO_2$, MgO, where the semiconductors can include Si, Ge, GaAs, copper indium gallium (di)selenide (CIGS), CdTe, InP, GaN, or GaP.

In another aspect of the invention, the nanoparticles have a vertical cross-sectional shape that can include triangular, circular, trapezoidal, hexagonal rectangular, and square. Here, an angle between a base of the trapezoid and a leg of the trapezoid are in a range of 90-75 degrees.

In a further aspect of the invention, the nanoparticles have a horizontal cross-sectional shape that can include square, rectangular, hexagonal, triangular, circular, and, trapedzoidal.

In yet another aspect of the invention, a width of a nanostructure in the pattern of nanostructures is in a range of 40 nm to 200 nm.

In one aspect of the invention, a separation between adjacent nanowires, nanoparticles, or nanowires and nanoparticles is less than approximately $\lambda/2$ of a wavelength $\lambda$ of interest of the incident light. Here, the incident light includes wavelengths in a range of 200 nm to 15 µm.

In a further aspect of the invention, a plurality of the nanoparticles having different sizes and different shapes are interspersed on the substrate, where the interspersed nanoparticles are configured to add additional doubly-resonances to the metasurface AR coating, where the doubly-resonances include combined Mie and Fabry-Pérot resonances, where a broadening of antireflection in the AR coating is provided.

In another aspect of the invention, a height of a nanostructure in the nanostructure pattern is in a range of 60 nm to 200 nm.

According to one aspect of the invention, a periodicity of nanostructure in the nanostructure pattern is in a range of 120 nm to 300 nm.

In one aspect of the invention, the patterning method comprises lithography, nanoimprint, or self-assembly. Here, the lithography method includes UV lithography, e-beam lithography, nanoimprint lithography.

In another aspect of the invention, the metasurface AR coating includes an average reflectance as low as 3.9% over a wavelength range of 425 nm-900 nm.

DETAILED DESCRIPTION

Figure 1A:
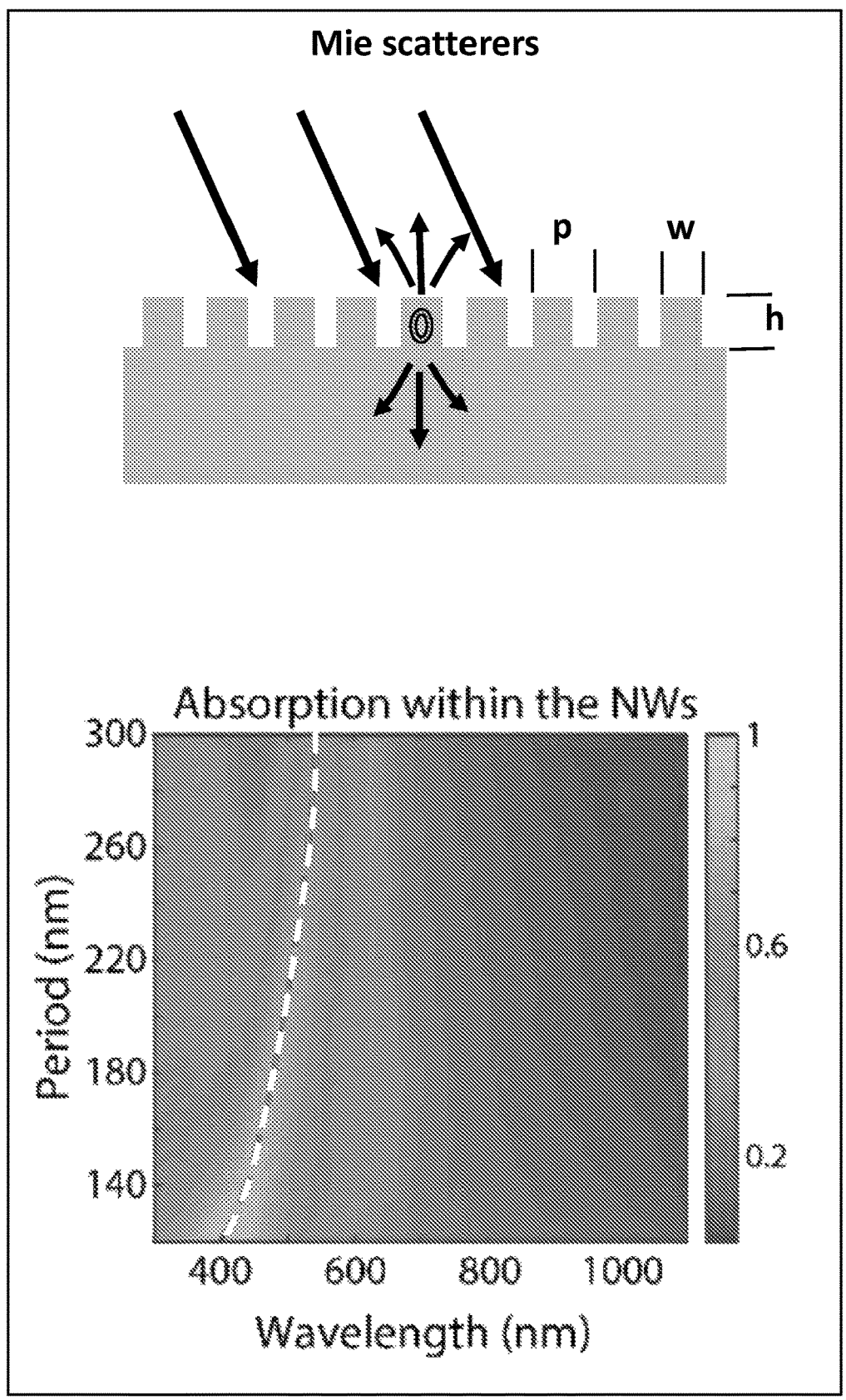
FIGS. 1A-1C show (1A) simulated absorption in the nanowire array as a function of p and λ. (1B) Analytically calculated reflectance of a slab of index $n_{eff}$ on a substrate with index $n_{sub}$=4+i 0.1 as a function of p (and thus $n_{eff}$) and λ, (1C) Simulated reflectance (color) of an array of nanowires on a substrate (w=80 nm, h=120 nm) as a function of p and λ, according to the current invention.

Minimizing reflection losses is a compelling task that is required in the design of basically every optical component. Indeed, from the macro-scale to the nano-scale, light reflected off an interface between two optical media is most likely lost.

Anti-reflection (AR) coatings based on Fabry-Pérot resonances, or interference coatings, are the standard solution to the problem and are also adopted on an industrial scale. Recent works proved that high-index nanostructures can also reduce reflection upon excitation of Mie resonances that are well coupled to the substrate. Provided here in are a design, theoretically modeled and fabricated Si metasurfaces that, combining Mie and Fabry-Pérot resonances using nanowires and/or nanoparticles formed in a pattern of nanostructures, that are capable of displaying broadband anti-reflection response. The provided example with Si can be extended to other dielectric and semiconductor materials with a high refractive index. Finally, optically characterize the metasurfaces demonstrating 4.1% and 3.9% AM1.5-averaged reflectance for unpolarized light and polarized light respectively across the visible spectrum (425-900 nm) are provided, according to one embodiment of the invention.

Provided herein are silicon (Si) metasurfaces that combine classic interference coatings, which are characterized by Fabry-Pérot-type resonances, and resonant substrate-coupled Mie scatterers within a single structure. According to one aspect of the invention, by carefully arranging nanostructures, such as nanowires, nanoparticles, or nanopillars, in engineered arrays, broadband and spectrally engineered anti-reflection is achieved. Using a theoretical model based on coupled mode theory (CMT), intuitive insight is gained into the multi-modal interaction between the Fabry-Pérot and Mie resonances within the nanopatterned layer. Experimental results provided herein demonstrate broadband anti-reflection (425-900 nm) with a 3.9% AM1.5-averaged reflectance for a specific polarization, and 4.1% AM1.5-averaged reflectance for unpolarized light. In a further aspect of the invention, the multi-resonant metasurface structure can be generalized to all high-index materials and other wavelength ranges, making it suitable for a broad range of applications including solar cells, sensors, and other optical components.

In one aspect of the invention, a separation between adjacent nanowires, nanoparticles, or nanowires and nanoparticles is less than approximately $\lambda/2$ of a wavelength $\lambda$ of interest of the incident light. Here, the incident light includes wavelengths in a range of 200 nm to 15 µm. In one aspect of the invention, the substrate can include Si, Ge, GaAs, copper indium gallium (di)selenide (CIGS), CdTe, InP, GaN, GaP, or $TiO_2$.

In another aspect of the invention, the film on the substrate can include dielectrics or semiconductors, where the dielectrics can include silicon nitride, titanium dioxide, transparent oxides such as ITO or ZnO, glasses such as $SiO_2$, MgO, where the semiconductors can include Si, Ge, GaAs, copper indium gallium (di)selenide (CIGS), CdTe, InP, GaN, or GaP.

Figure 1B:
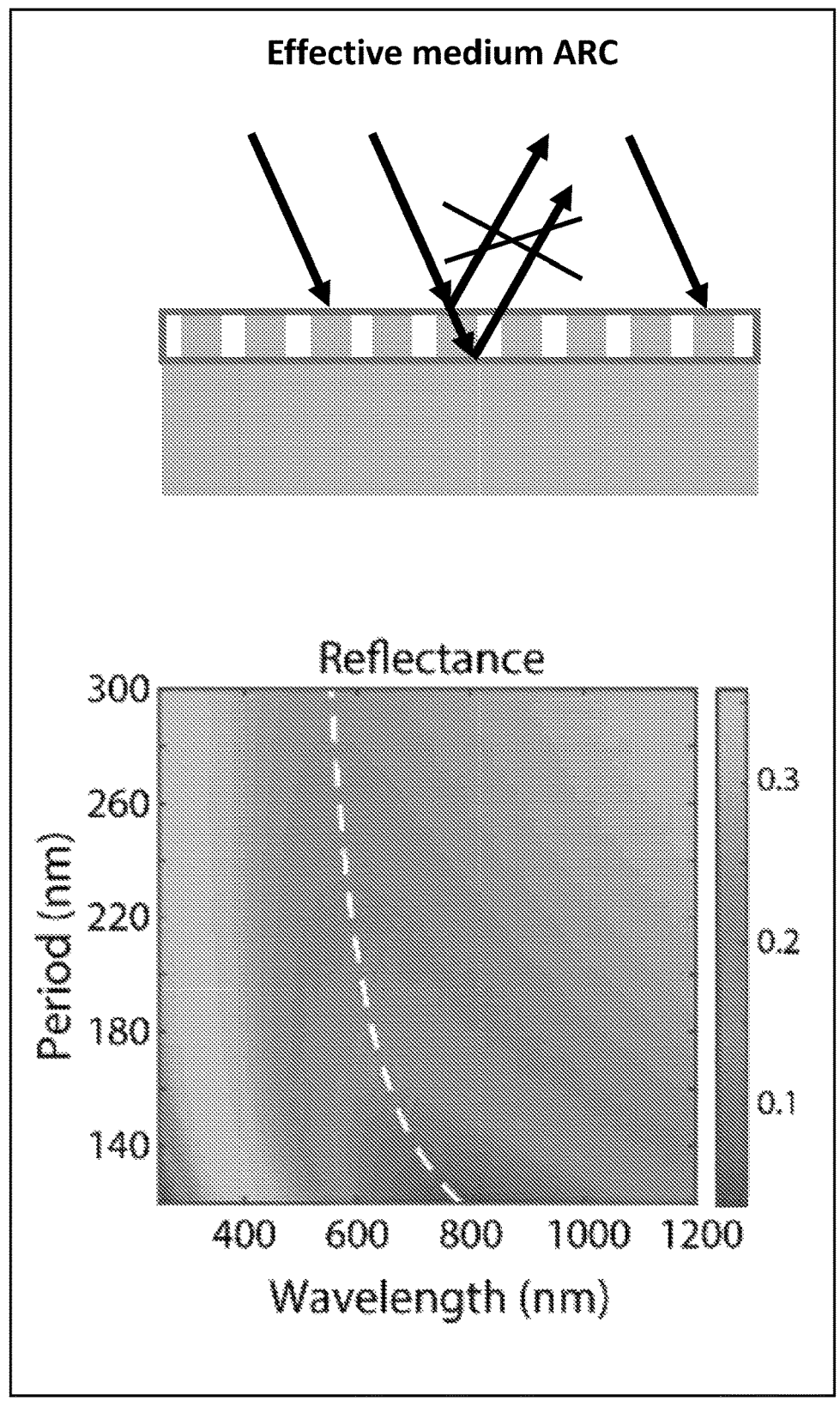
Figure 1C:
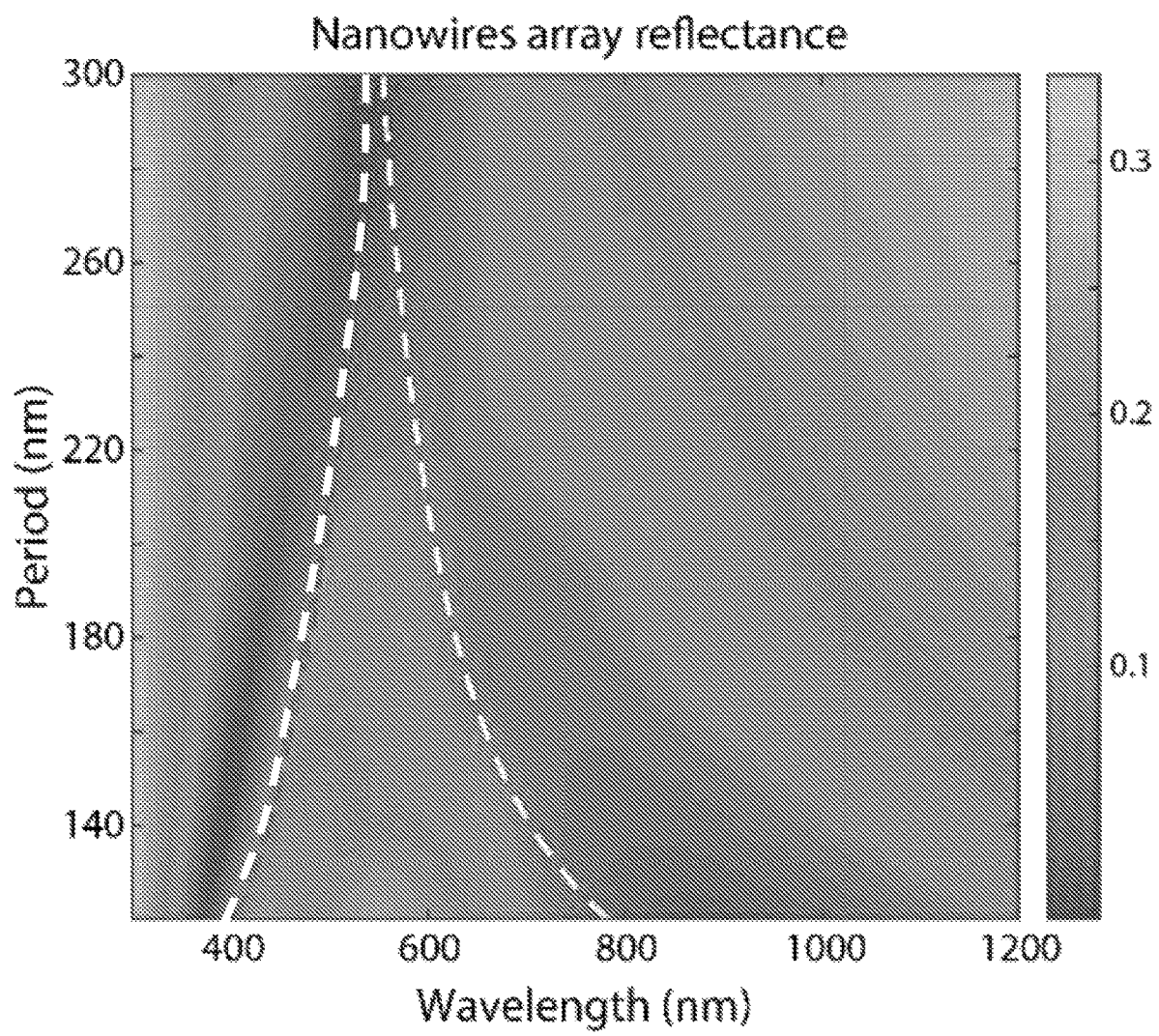

According to one embodiment of the invention, a metasurface design is provided having arrays of nanowires (for the case of polarized light) or nanopillars (for unpolarized light) carved directly into Si that show a particular multi-resonant behavior in the visible spectral range (FIGS. 1A-1C). On one hand, light with short wavelengths will resonantly couple to the nanostructures as a result of the lowest-order Mie mode (Magnetic Dipole). As a result, light is efficiently scattered into the substrate giving rise to low reflection (FIG. 1A). On the other hand, the periodicity is small compared to the long-wavelength part of the spectrum. Therefore, light will "see" the array as a layer with an effective index $n_{eff}$ with a value between that of air ($n_m$) and of the substrate ($n_{sub}$), which can function as an interference coating (FIG. 1B). The relation between $n_{eff}$ and the structure geometry is described by Effective Medium Theory (EMT). Specifically, for anisotropic structures such as a nanowires array and in first order approximation, the effective index depends on the polarization of incoming light $$n_{eff}^{\perp} = \left(\frac{1-F}{n_m^2} + \frac{F}{n_{sub}^2}\right)^{-1/2} \quad (1)$$

$$n_{eff}^{\parallel} = \left((1-F)n_m^2 + Fn_{sub}^2\right)^{1/2}$$

where $n_{eff}^{\perp}$ is used if E is polarized perpendicular to the wire axes (TE polarization), $n_{eff}^{\parallel}$ if E is polarized along the wire axes (TM), and F is the filling fraction. However, for most practical purposes the polarization-independent geometry based on nanopillars is more relevant. In the latter case the effective index is given by the root mean square of $n_{eff}^{\perp}$ and $n_{eff}^{\parallel}$.

Conceptually, light can take two paths: a resonant pathway (FIG. 1A) involving Mie scattering and a direct (spectrally broad resonant) pathway (FIG. 1B) governed by the effective-index layer just described.

In order to investigate the interplay of the two pathways, FIG. 1C shows the simulated (Lumerical FDTD24) reflectance spectra of an array of nanowires under normal incidence (TE polarized) as a function of the periodicity p. The individual wires are 80 nm wide, 120 nm high, and a refractive index $n_{sub}$=4+i 0.1 is used as a non-dispersive simplified model for Si. These full-field simulations include both pathways. Interestingly, only one reflection minimum is observed for large periodicities, while another dip appears as the array periodicity is reduced, allowing a broader and more efficient anti-reflection behavior.

To identify the origin of the two minima, two dashed lines are added to FIG. 1C indicating the resonance wavelength of the isolated mechanisms (FIGS. 1A-1B). Indeed, the dashed line marks the peak of the power absorbed within the wires (FIG. 1A), which is a good indication of the system's Mie resonance wavelength as a function of the array periodicity. For small periods, the magnetic dipole modes in neighboring wires couple, giving rise to a blue-shift. Hence this dashed line highlights the resonant pathway in FIG. 1C. On the other hand, if the array is replaced by a slab of thickness h=120 nm with index given by Eq. 1 (with $n_m$=1) it is possible to analytically retrieve the reflectance as a function of the filling fraction—and thereby the periodicity. FIG. 1B shows the reflectance as a function of p and $\lambda$. Reducing the period from 300 nm to 120 nm for fixed wire width (80 nm), the minimum shifts to longer wavelength and becomes lower as $n_{eff}$ increases and gets closer to the ideal AR condition $n_{eff}=\sqrt{n_m n_{sub}}$. The dashed white line (FIG. 1B) indicates the reflectance minimum as a function of filling fraction and helps to identify the direct pathway in FIG. 1C. This pathway will be referred to as the Fabry-Pérot background.

The nanostructure feature width is defined by range in which the Mie resonance is expected or desired. In one embodiment, the range is chosen in order to place the resonance within the visible spectrum. According to the current invention, to optimize the spectrum for another wavelength range (e.g. IR) or for another material (i.e. another refractive index) the width range is changed accordingly. This aspect of the invention applies for the periodicity between the nanostructures, and the height of the nanostructures. In a further embodiment of the invention, the pattern of nanostructures can include a mix of widths, heights, periodicities, and shapes of the nanostructures within a single pattern, where these combinations are disposed according to an incident light wavelength range or set of wavelength ranges that can include for example 400 nm-900 nm, 900 nm-2000 nm, 2000 nm-7000 nm, and 7000 nm-15000 nm. According to one aspect of the current invention, the angular transmission properties are optimized by selecting the correct materials, shapes, and arrangements.

In one aspect of the invention, a separation between adjacent nanowires, nanoparticles, or nanowires and nanoparticles is less than approximately $\lambda/2$ of a wavelength $\lambda$ of interest of the incident light. Here, the incident light includes wavelengths in a range of 200 nm to 15 µm.

In yet another aspect of the invention, a width of a nanostructure in the pattern of nanostructures is in a range of 40 nm to 200 nm.

In a further aspect of the invention, a plurality of the nanoparticles having different sizes and different shapes are interspersed on the substrate, where the interspersed nanoparticles are configured to add additional doubly-resonances to the metasurface AR coating, where the doubly-resonances include combined Mie and Fabry-Pérot resonances, where a broadening of antireflection in the AR coating is provided.

In one aspect of the invention, the substrate can include Si, Ge, GaAs, copper indium gallium (di)selenide (CIGS), CdTe, InP, GaN, GaP, or $TiO_2$.

In another aspect of the invention, the film on the substrate can include dielectrics or semiconductors, where the dielectrics can include silicon nitride, titanium dioxide, transparent oxides such as ITO or ZnO, glasses such as $SiO_2$, MgO, where the semiconductors can include Si, Ge, GaAs, copper indium gallium (di)selenide (CIGS), CdTe, InP, GaN, or GaP.

In another aspect of the invention, a height of a nanostructure in the nanostructure pattern is in a range of 60 nm to 200 nm.

According to one aspect of the invention, a periodicity of nanostructure in the nanostructure pattern is in a range of 120 nm to 300 nm.

In one aspect of the invention, the patterning method comprises lithography, nanoimprint, or self-assembly. Here, the lithography method includes UV lithography, e-beam lithography, nanoimprint lithography.

In another aspect of the invention, the metasurface AR coating includes an average reflectance as low as 3.9% over a wavelength range of 425 nm-900 nm.

FIG. 1 shows how the metasurface reflectance is determined by the combination of two pathways. However, it is important to stress that the position of the minima in FIG. 1C does not necessarily coincide with the minima that the two pathways would generate individually. In fact, the interference of a broad background and a resonant process gives rise to a characteristic asymmetric Fano line-shape. For such a resonance, the distance between the minimum of the spectrum and the resonant frequency depends on the so-called Fano shape parameter, which describes the degree of asymmetry. Moreover, also the second minimum is slightly shifted compared to that of the Fabry-Pérot background alone due to the presence of the resonant pathway. Equivalently, the phase of the light scattered by each mechanism plays a key role in achieving destructive interference in the backward direction, and thereby to achieve suppressed reflection.

The coupled mode theory (CMT) formalism is used to investigate the interaction of the two resonant mechanisms. CMT is very powerful in describing the behavior of coupled resonances and enables the possibility of calculating the reflectance of an optical system by modeling its interaction with incident light through a direct process and a resonant process. The reflectance of the coupled system is given by:

$$R = \left| r_{12} + \frac{Ae^{i\phi}}{i(\omega - \omega_0) + g} \right|^2 \quad (2)$$

Here, $r_{12}$ is the Fresnel reflection coefficient for a dielectric slab of index $n_{eff}$ on a substrate. The parameters $\omega_0$, A, $\phi$ and g determine the resonance frequency, amplitude, phase offset and width of the Lorentzian function in the second term. The first term represents the Fabry-Pérot (direct) pathway while the second term corresponds to the Mie-resonant behavior of the nanostructured array (resonant pathway).

Figure 2A:
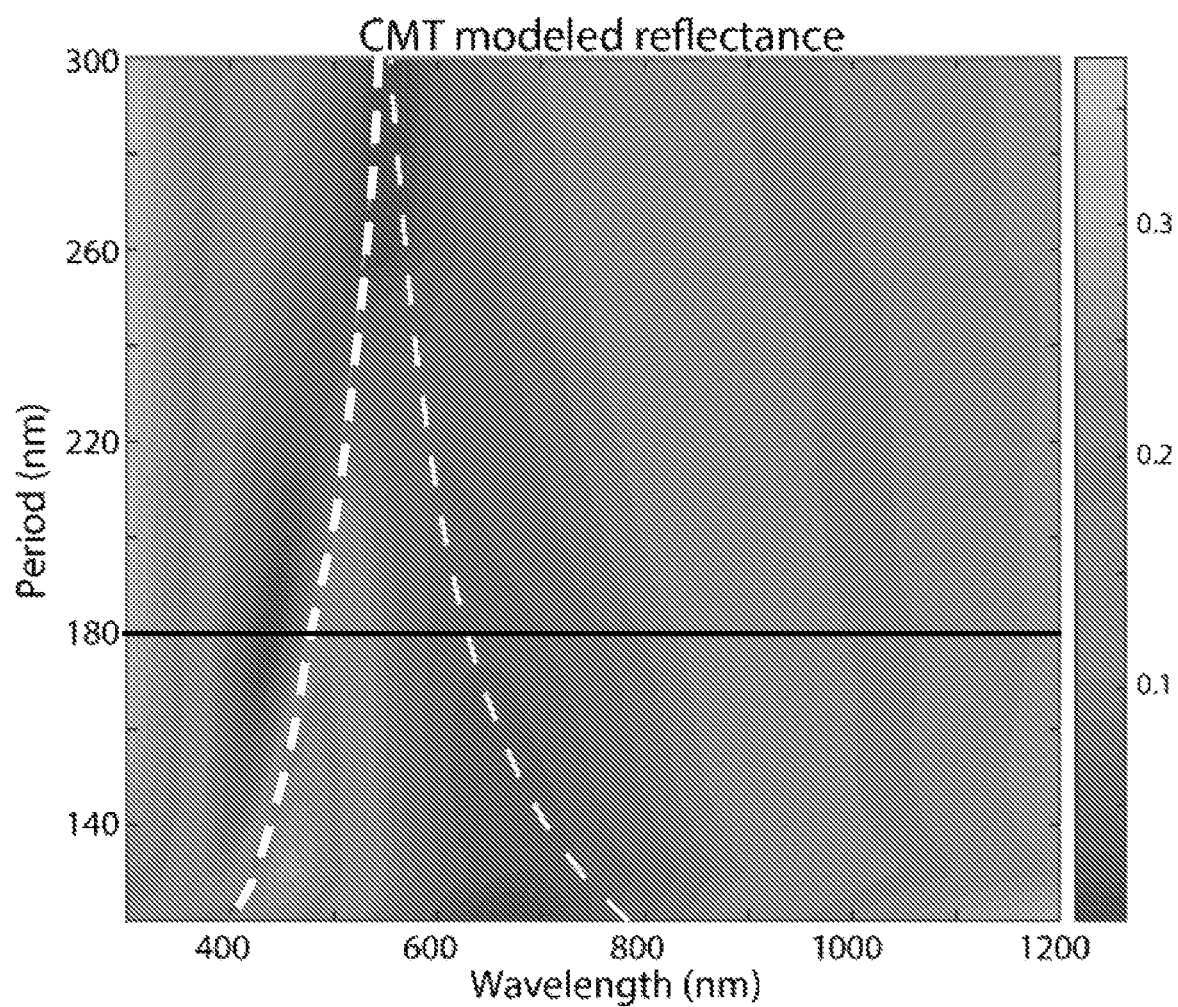
FIGS. 2A-2E show (2A) CMT-modeled reflectance (colormap) obtained from fitting of all the spectra composing FIG. 1B, (2B, 2D) comparison between simulated (dashed) and CMT-fitted spectra for an array of nanowires (w=80 nm, h=120 nm) for p=300 nm (2B) and p=180 nm (2D). square modulus of the direct and resonant pathways composing the fits are also shown, where the label (reflectance) does not apply to the resonant pathway, (2C, 2E) phasor diagram representation of the two pathways at the wavelengths of the minima (dashed lines) in (2B, 2D), according to the current invention.

To demonstrate that the doubly-resonant nature observed in FIG. 1 is well-described by CMT, the full-field simulated spectra is fit by means of Eq. 2. A quick inspection of Eq. 2 reveals that the dependent parameters are $n_{eff}$, $\omega_0$, A, $\phi$ and g. Fitting all these parameters is neither convenient nor reliable, thus it is useful to recover as many parameters as possible by other means and then feed them to the curve-fitting algorithm. As mentioned, $n_{eff}$ is a function of the filling fraction of the array, and a reasonable estimate of $\omega_0$ can be obtained from the frequency of maximum absorption within the wires (FIG. 1A). Based on these assumptions, the 21 spectra composing FIG. 1C have been fitted and stitched together to generate FIG. 2A. Despite its simplicity and approximations, the agreement between CMT model and full-field simulations is strong. Moreover, the model is reproducing the simulated trend for a very large range of wavelengths and periodicities. This agreement, in turn, proves that the physics behind the metasurface is a result of two interacting optical pathways and that the CMT model can be used to study how their interaction gives rise to broadband anti-reflection.

Figure 2B:
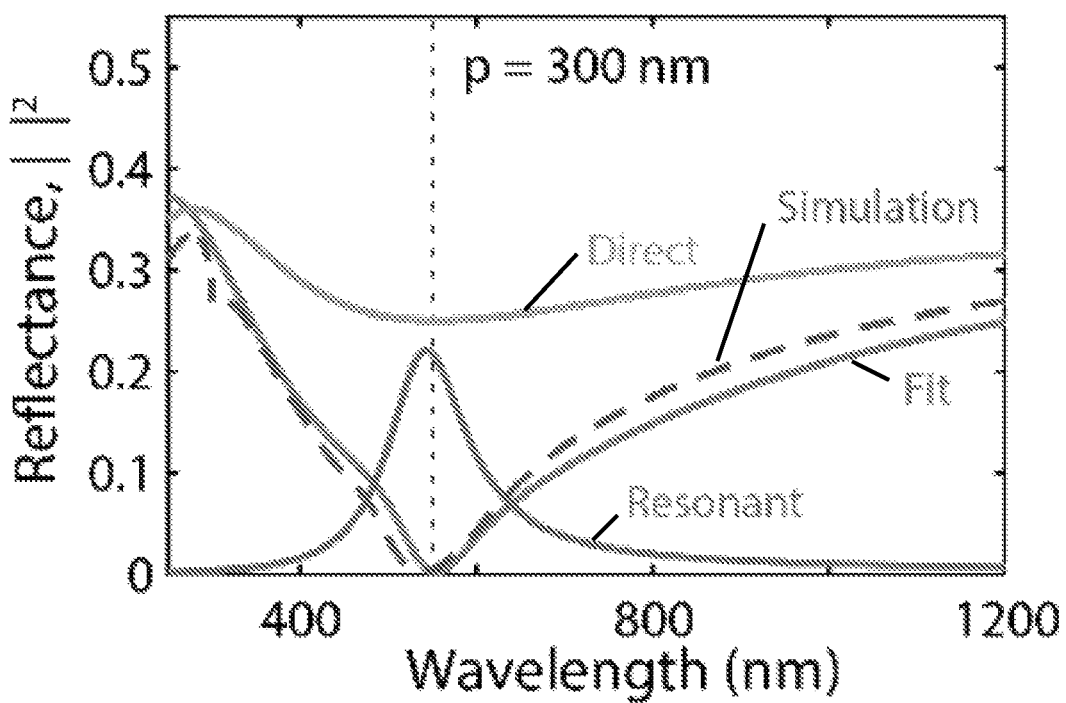
Figure 2C:
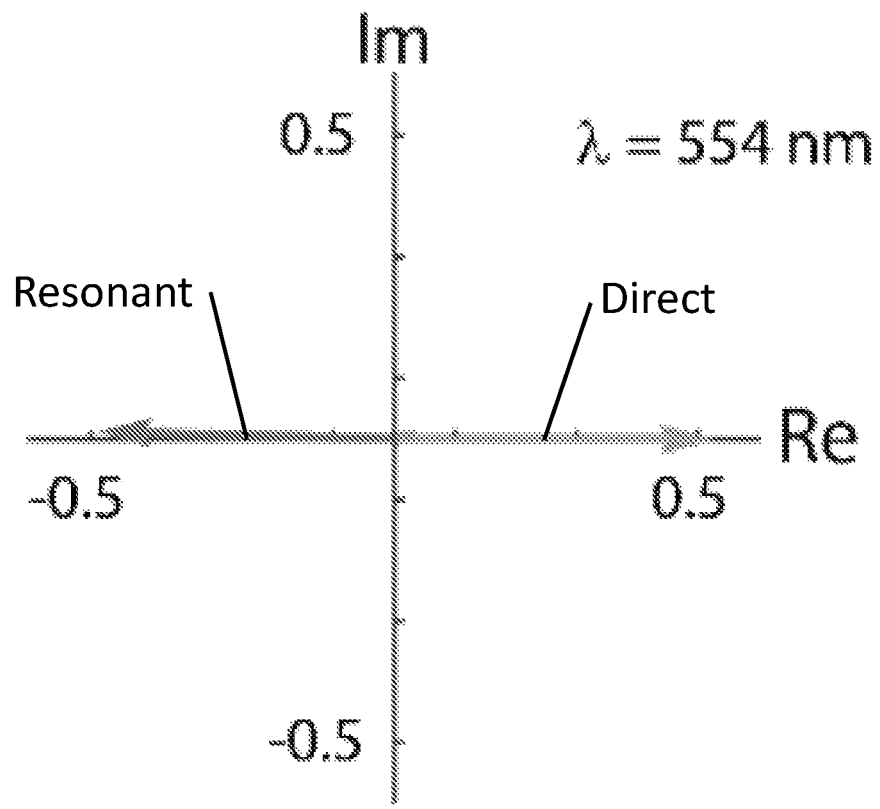
Figure 2D:
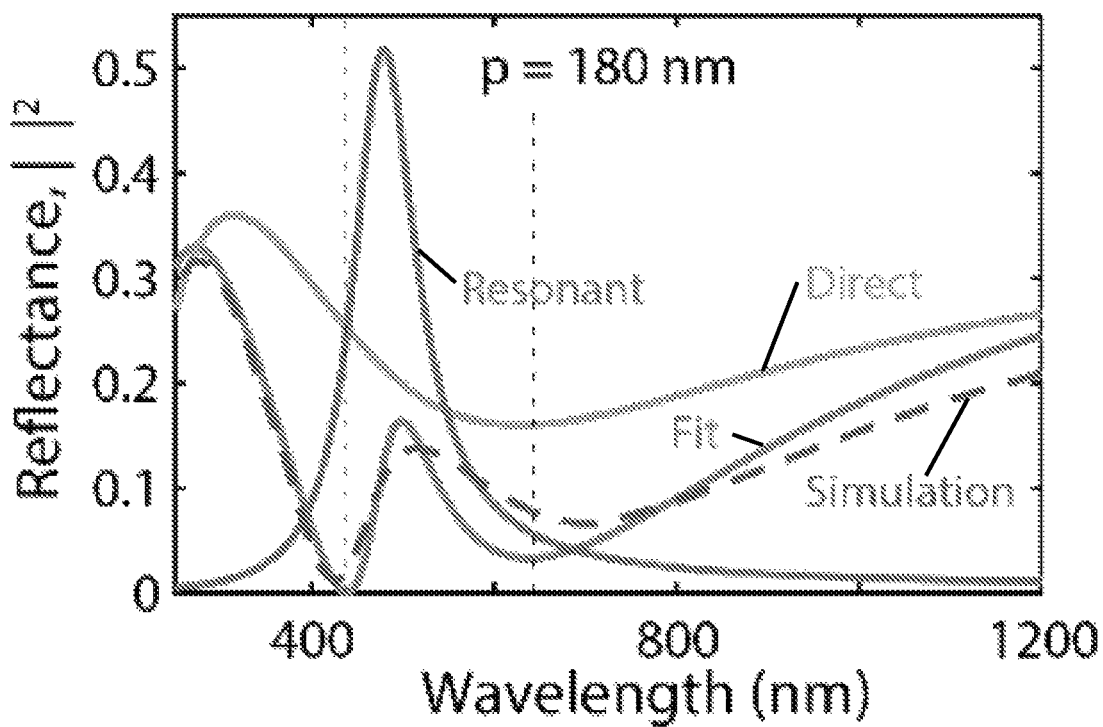
Figure 2E:
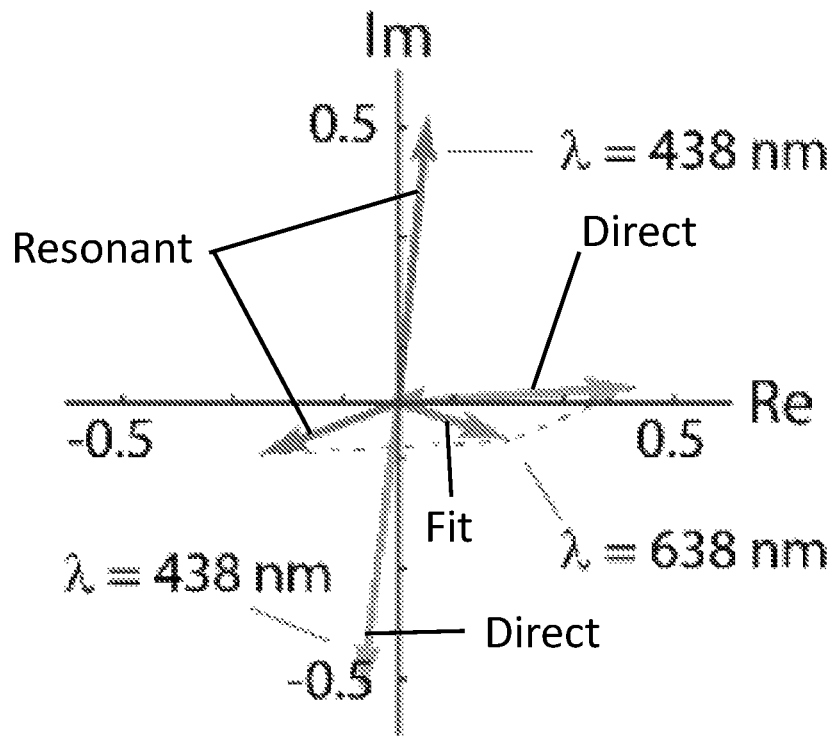

Due to the complex nature of the two terms in Eq. 2, anti-reflection behavior at multiple spectral locations is not obtained by simply adding two pathways that would generate a dip in reflectance when isolated. To fully exploit the doubly resonant nature of the structure according to the current invention, the amplitude of the direct and resonant pathways must match with a π phase difference. To evaluate whether these conditions are met, two spectra in the single-dip and double-dip regime are isolated (p=300 nm and p=180 nm respectively) and plotted along with the amplitude of the corresponding direct and the resonant pathways (FIG. 2B and FIG. 2D). The spectra obtained from the full-field simulations are also shown, demonstrating good correspondence with the CMT fit. For p=300 nm (single-dip regime) the direct and resonant pathways are almost equal in amplitude on resonance (λ=554 nm, FIG. 2B). To study the relative phase at resonance, a phasor diagram is used to simultaneously plot the amplitude and phase of the two pathways in the complex plane (FIG. 2C). The resulting reflectance can be obtained by vectorial addition of the direct and resonant components. FIG. 2C clearly demonstrates that the two pathways are close to equal in amplitude and π out of phase simultaneously, giving rise to low reflectance. In the double-dip regime (p=180 nm) on the other hand, the interference of the two pathways gives rise to a characteristic asymmetric Fano line-shape superimposed on a broad Fabry-Pérot background. The amplitude is matched twice (FIG. 2D) but only for the first dip (λ=438 nm) the AR condition is almost perfectly satisfied. Indeed, the second dip is slightly red-shifted with respect to the second amplitude-matching wavelength, and the phase difference between the pathways is slightly less than π (FIG. 2E). As a result, the reflection is not completely canceled.

Finally, it is possible to design both resonant mechanisms—and therefore the entire reflectance spectrum—at will through careful engineering of the nanostructure dimensions. For example, increasing the height of the wires results in a thicker effective layer and hence shifts dip in the Fabry-Pérot background to longer wavelengths. On the other hand, changing the dimension of the wires also results in a change in the Mie resonant properties. Thus the structure's design according to one embodiment is not carried out by simple numerical minimization of the average reflectance but is rather obtained through judicious design of the interplay of the two mechanisms using the theoretical model.

To demonstrate the doubly-resonant metasurface AR-coating experimentally, an exemplary Si nanowire array metasurface AR coating was fabricated and its reflection spectrum was measured. Using the dispersive index of Silicon and aiming to place both dips within the visible spectrum, the designed geometry for polarized light is a nanowire array with w=80 nm, h=120 nm, and p=180 nm. The structures were fabricated by means of electron-beam lithography (EBL). Here, clean silicon substrates were spin-coated with ~80 nm of hydrogen silsesquioxane negative e-beam resist (HSQ, 4% in methyl isobutyl ketone), and baked for 45 min at 90° C. Lines were fabricated in the HSQ by exposure using a JEOL JBX 6300 lithography system (100 kV, dose 1500-3500 µC/cm$^2$) and development in tetramethylammonium hydroxide (TMAH 25%, 120 s). The pattern was then transferred into the silicon by two-step reactive-ion etching using $C_2F_6$ and HBr, respectively.

Figure 3A:
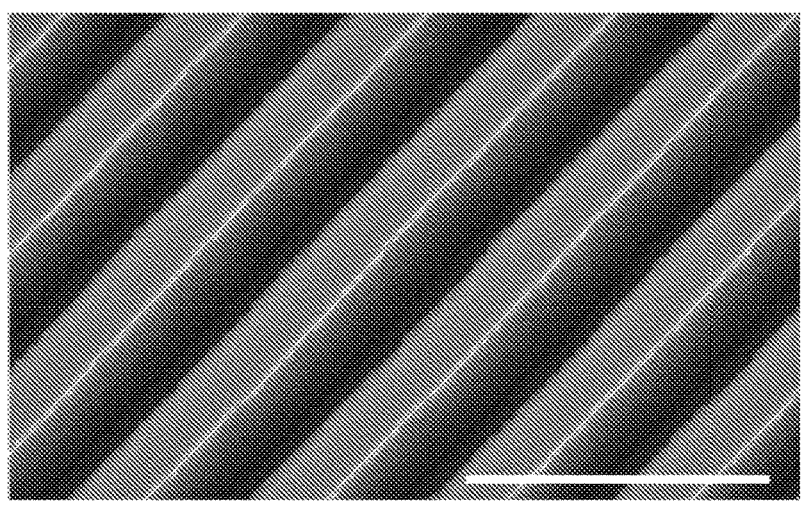
FIGS. 3A-3D show (3A) tilted SEM image of the nanowire array, (3B) FIB cross section of nanowire array shows slight slanting of side walls, where the scale bar in (3A) and (3B) is 400 nm, (3C) Depth profile analysis obtained from AFM line-scan, (3D) experimental and simulated (dashed) reflection spectra, where insets: magnetic field amplitude profile and absorption within the wire, where the vertical line of long dashes highlights the Mie resonance while the vertical line of short dashes indicates the onset of diffraction in the substrate, according to the current invention.
Figure 3B:
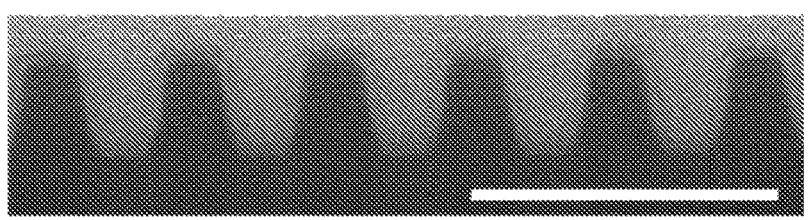

Finally, the cross-linked HSQ mask was etched away using HF (5% in H2O). The resulting nanowire array is composed of smooth Si wires and is uniform over a large area (FIG. 3A). The focused-ion-beam (FIB) cross-section shows slight slanting of the walls as a result of non-perfect anisotropy during the etch process (FIG. 3B).

Figure 3C:
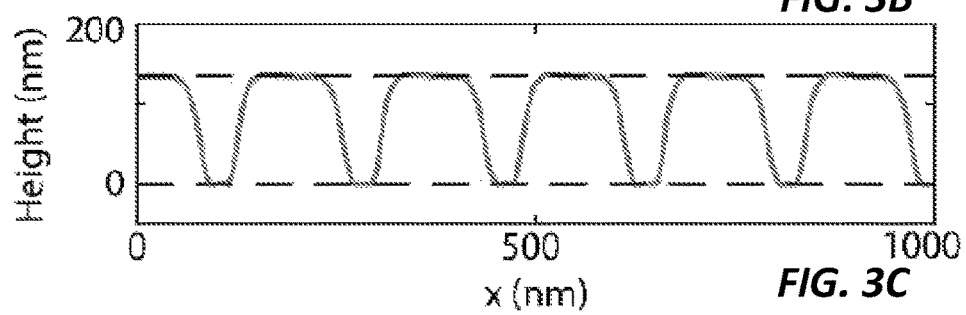

The as-fabricated NW dimensions are obtained from SEM (FIG. 3A), FIB (FIG. 3B) and atomic-force microscope analysis (FIG. 3C). The resulting height is h~143 nm while the width is changing from top to bottom in the range 67-116 nm (FIGS. 3A-3C). The experimental setup used to measure the local reflectance spectra is a Nikon C1Si Confocal Microscope equipped with a Princeton Instruments SpectraPro 2300i spectrometer and PIXIS CCD-detector. Using a 20× objective (Nikon, NA=0.4) and a 100 μm pinhole, the local reflection of the NW array was measured over the 400-900 nm spectral range. A silver coated mirror (Thorlabs PF10-03-P01) is used as a reference. Also, the microscope's aperture diaphragm (A-stop) was closed to ensure the smallest incidence angle possible, and a polarizer in the collection path is used to select the TE polarized light.

Figure 3D:
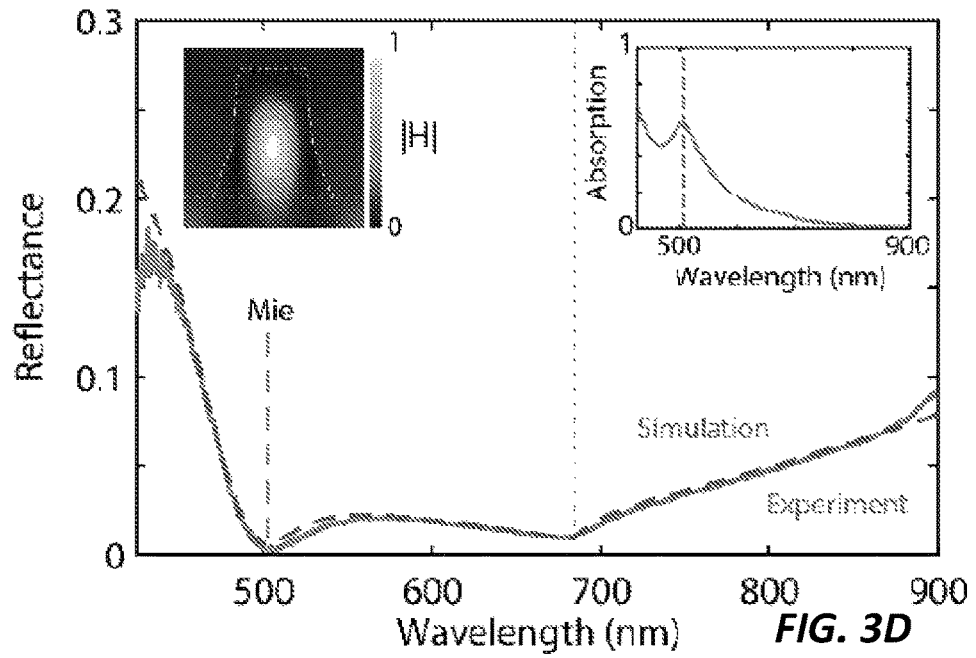

The measured reflectance spectrum (FIG. 3D) experimentally demonstrates the double-dip in reflectance as a result of the doubly-resonant behavior of the metasurface AR coating. First, a minimum located at 500 nm due to the magnetic dipole resonance in the individual wires is present. To corroborate this, the absorption within the nanowires is shown as an inset, which exhibits a clear peak around $\lambda=500$ nm due to resonant absorption. Also shown is the magnetic field amplitude at resonance, with the characteristic magnetic dipolar profile clearly observable. Second, a spectrally-broad minimum is observed between $600<\lambda<800$-nm due to the Fabry-Pérot resonance. The kink in reflectance close to 700 nm is due to the Rayleigh anomaly at the diffraction edge. Using the actual dimensions and shape extracted from FIB cross-sections and AFM line scans to account for fabrication imperfections, it is possible to compare the experimental spectra to its FDTD-simulated counterpart. The resulting spectrum (FIG. 3D) shows very good correspondence to the experimental spectrum. Broadband AR is thus obtained from two separate spectrally engineered resonant modes within the same metasurface coating, with an averaged experimental reflectance as low as 3.9% over the 425-900 nm wavelength range (weighted for the AM 1.5 solar spectrum). The experimentally observed double-dip is not as evident as in the theory (FIG. 2D) and this can be understood by assessing the impact of fabrication imperfections on the reflectance of our structure, as discussed in depth within the next section.

Figure 4A:
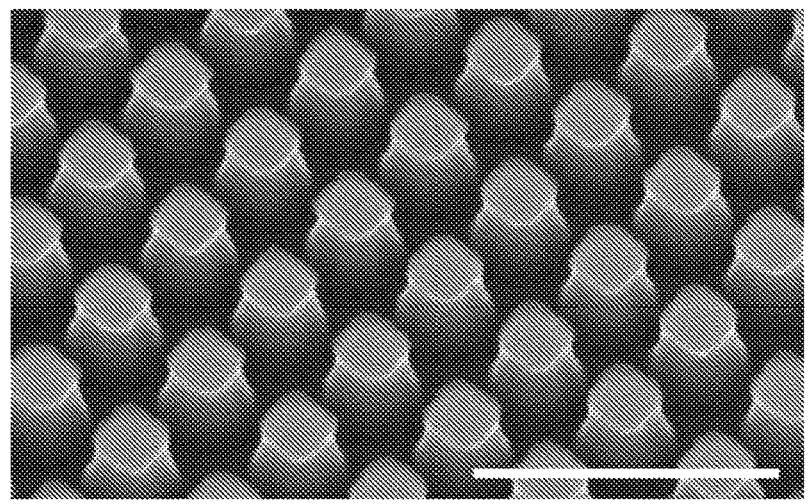
FIGS. 4A-4D show (4A) tilted SEM image of nanopillar metasurface, (4B) FIB cross section of nanopillar array. The scale bar in (4A) and (4B) is 400 nm, (4C) shows a depth profile analysis obtained from AFM line-scan, (4D) experimental and simulated (dashed) reflection spectra. Insets: magnetic field amplitude profile and absorption within the nanopillar, where the dashed vertical line highlights the Mie resonance while the dashed line indicates the onset of diffraction in the substrate, according to the current invention.
Figure 4B:
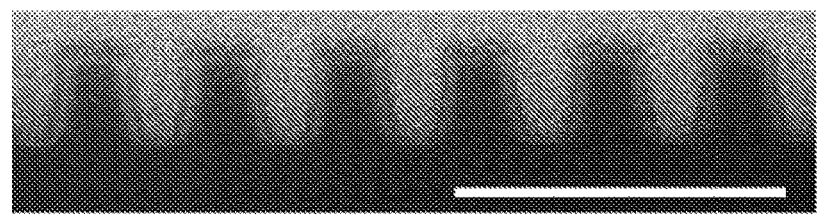
Figure 4C:
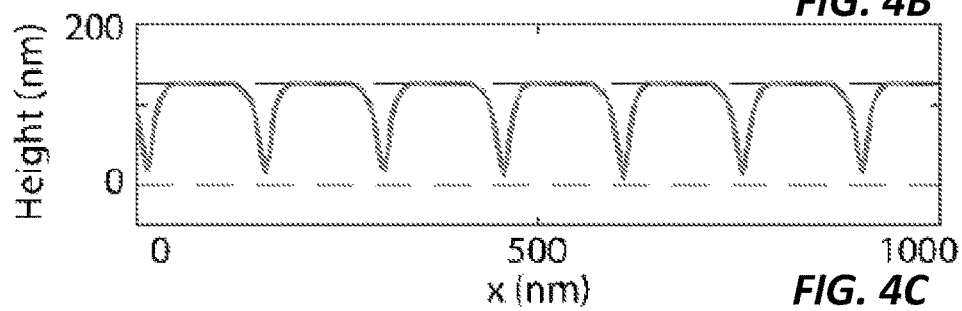

The results thus far demonstrate how anisotropic structures—like the arrays of Si nanowires in FIG. 3A—can combine two resonant mechanisms to obtain broadband AR for polarized light. Most practical applications, however, require efficient AR for unpolarized light. To demonstrate the multi-resonant metasurface concept for unpolarized light, an array of nanopillars were designed with w=90 nm, h=115 nm, and p=150 nm. FIG. 4 displays the structural and optical characterization of the fabricated nanopillar array. Similar to the nanowires array, SEM and FIB analysis reveal a good sample uniformity yet slanted sidewalls (FIGS. 4A-4B). Combining FIB cross sections and AFM line scans (FIG. 4C) the measured as-fabricated dimensions are h=125 nm and a width varying from 75 nm at the top of the pillars to 116 nm at the bottom.

Figure 4D:
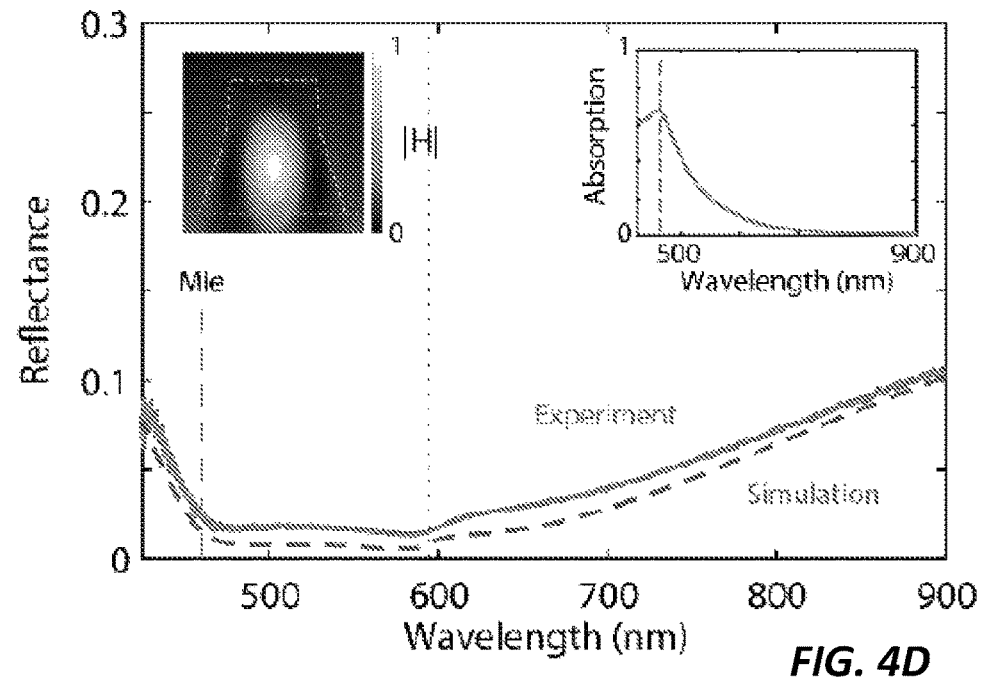

As for the nanowire array, the slanting is strongly affecting the optical response of the system (FIG. 4D). Although the double-dip is not visible, it is still possible to distinguish the same features that characterize the nanowires array reflectance spectrum: around 450 nm the Mie mode (shown as inset of FIG. 4D) is carving the first dip in reflectance on top of a very broad and low Fabry-Pérot minimum that extends up to 800 nm. Also, a kink around 600 nm remarks the onset of diffraction into the substrate. The absence of the double-dip is due to the fact that the two pathways are spectrally closer compared to the case of the nanowires array. However, this proved to be beneficial to the performance of our structure showing a 4.1% AM1.5-averaged reflectance for unpolarized light. Again, the agreement between simulation and experiment is strong even though not perfect due to the challenging estimation of the actual structure size in all dimensions. Altogether, our experimental results demonstrate the capabilities of multi-resonant metasurfaces in suppressing reflection both for polarized and unpolarized light.

Figure 5A:
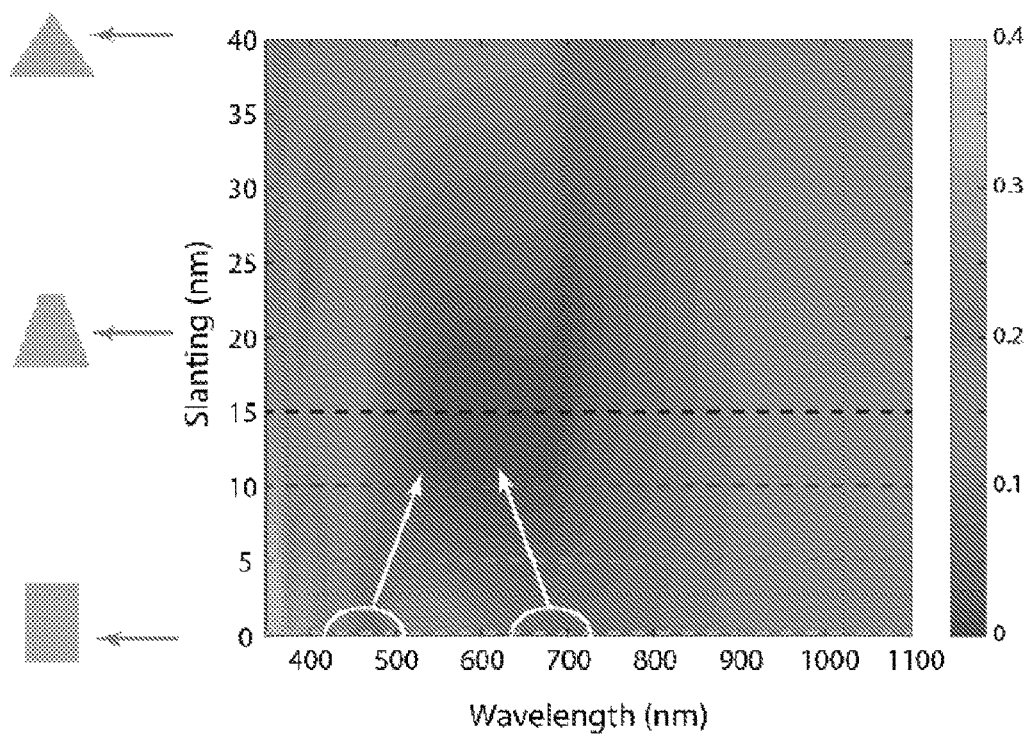
FIGS. 5A-5B show (5A) reflectance (color) for an array of Si nanowires (w=80 nm, h=120 nm, period 180 nm) as a function of λ and slanting of the side walls, (5Bb) Cross cuts through (a) for straight walls (0 nm slanting), 5 nm slanting, 10 nm slanting and 15 nm slanting, according to the current invention.
Figure 5B:
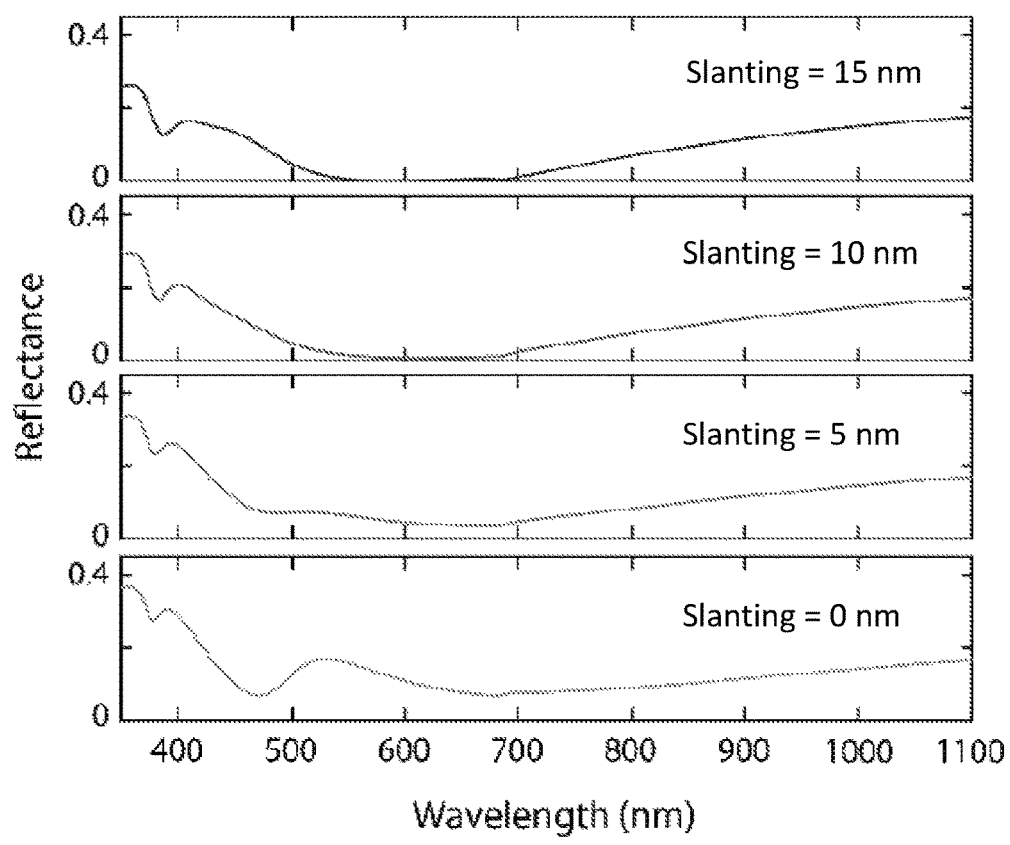

As mentioned, due to the non-perfect anisotropy during the reactive-ion etching, the side walls of the resonator nanowires are not perfectly straight. To assess its influence on the reflectance, FIG. 5A shows the simulated reflectance (color) of an as-designed Si nanowires array (w=80 nm, h=120 nm) with period p=180 nm as a function of wavelength and side wall slanting. Specifically, the sidewalls of the structures were rotated around their center, keeping the height constant and therefore keeping their width at half height constant. FIG. 5B shows cross cuts of (5A) for straight walls (slanting of 0 nm) and for increasing values of slanting.

The striking feature of FIG. 5A is that the two dips as a result of the different resonant mechanisms merge into a broad single dip with increasing slanting. In fact, the reflection at the merged minimum (at 15 nm slanting) is remarkably low. To investigate this phenomenon, the consequences of slanted sidewalls on the resonant and on the direct pathways are analyzed separately.

The resonant pathway is broadening and red-shifting with increased slanting. The characteristic displacement current loops of the MD mode are moving into the substrate as the sidewalls become tilted. As a result, the resonator is more coupled to the substrate and the leakage rate into the substrate increases, giving rise to a broadening of the resonance. In addition, the lateral dimension of the currents loops increases with slanted sidewalls thus the "effective resonator" is wider and its resonance wavelength red-shifts. On the other hand, the direct pathway of slanted nanowires can be approximated by treating the wire cross-section as N effective layers with increasing effective indices. Changing the angle of the sidewalls is accounted for by changing the set of effective indices (see Supplementary Info). The consequences of slanting are a blue-shift of the first Fabry-Pérot minimum and a general reduction in reflection as a result of the graded-index that is effectively obtained for large slanting of the side walls. Thus, the dashed lines of FIG. 1C move closer together with increased slanting of the side walls. In addition, the average reflection is lower because both the pathways have reduced amplitude. Due to this relative shift, the pathways combine with different phase and instead of the asymmetric profile characteristic of the double-dip regime described earlier, the Mie resonance frequency coincides with the first reflection dip (see FIG. 3D). In fact, the coupling coefficients of the resonant pathway depend on the direct process and therefore changing the pathway's relative spectral position influences their relative phases. Note that the structures with slightly slanted sidewalls perform better than both perfect structures with straight walls and completely slanted ones (see FIG. 5A), which explains the low broadband reflectance that was observed experimentally. Thus, while the fabrication imperfections make the observation of the two reflection minima more challenging, the resulting broadband lower reflectance is highly beneficial for practical applications.

Disclosed herein is how to design, theoretically model and fabricate Si metasurfaces that, combining Mie and Fabry-Pérot resonances, capable of displaying broadband anti-reflection response. Specifically, presented herein is the working principle of the metasurfaces according to the current invention in a rather intuitive way supporting the explanation with CMT and showing a strong agreement between theory and FDTD simulations. Using the insights gained from CMT it is possible to design the interplay of the two pathways by changing the structures' geometry and hence place the double-dip in reflection within the visible spectrum. It is important to stress that this design can be tailored not only for different materials but also for other frequency ranges, with potential applications beyond solar cells (image sensors, detectors, displays components etc.). Both nanowire arrays and nanopillar arrays were fabricated experimentally using exemplary, but not limited to, electron-beam lithography (EBL), showing an experimental AM1.5-averaged reflectance as low as 4.1% and 3.9% for unpolarized and polarized light respectively. It is noted that other lithography methods may be used to achieve the results of the current invention. Detailed structural analysis of the fabrication imperfections and of their impact on optical properties revealed that slightly slanted structures give rise to broadening and overlap of the Mie and Fabry-Pérot resonances. As a result, even lower and more broadband anti-reflection performance is obtained than for perfect structures with straight walls. Finally, it is noted that the conceptual demonstration of multi-resonant metasurface AR coatings in this work could be up-scaled to practical applications with Substrate Conformal Imprinting Lithography (SCIL), which enables large-area printing of engineered nanometer-scale structures in an inexpensive manner.

As mentioned above, Coupled Mode Theory (CMT) is the closest mathematical translation to the intuitive explanation of the working principle of the structure given beforehand.

Figures 6A, 6B, 6C:
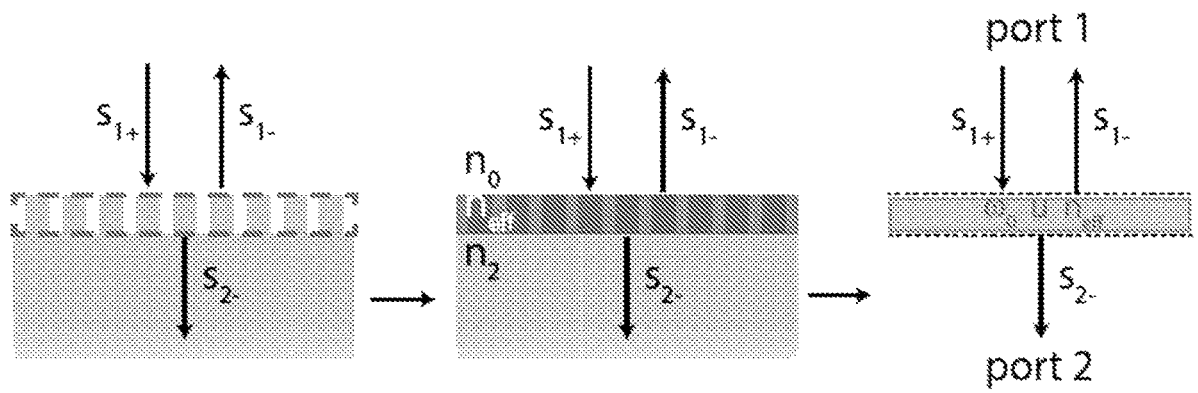
FIGS. 6A-6D show schematic drawings of a two-ports coupled resonator: (6A) the resonators are enclosed into a "box" (dashed) that define the optical system (6B) the direct pathway is given by the scattering matrix of a dielectric film of an effective index between two semi-infinite optical media (6C) final scheme for CMT; the dashed lines indicate the input/output planes, (6D) shows samples of nanowire and nanoparticle structure arrangements, according to the current invention.
Figure 6D:
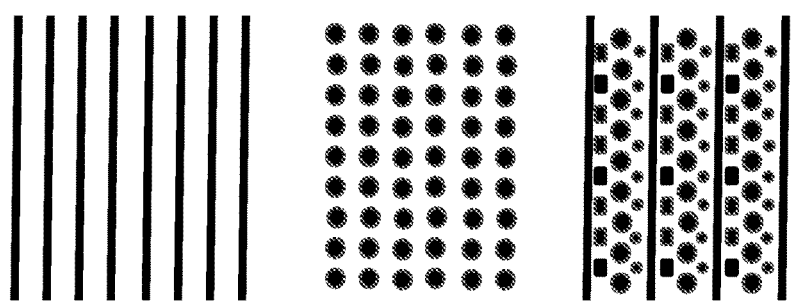

The first step includes of defining the optical system and the output and input planes. Hence, suppose the resonant structures of the current invention (nanopillars or nanowires arrays) are enclosed inside a "black box" (see FIGS. 6A-6C) simply stating that the complex field inside the box is u (normalized such that $|\mu|^2$ is the energy stored within the box due to the resonance) and that this system has a certain resonance frequency $\omega_0$. FIG. 6D shows samples of nanowire and nanoparticle structure arrangements.

Furthermore, the system according to one embodiment of the invention is coupled to two input/output ports being $s_+$ and $s_-$ the column vectors containing, respectively, the incoming and outgoing wave amplitudes from each channel (or port). The complex wave amplitudes are defined and normalized such that, for example, $|s_{1+}|^2$ is the power per unit area incident on the system (see FIGS. 6A-6C)

$$s_{1+} = \sqrt{\frac{cn_0\epsilon_0}{2}} E_{1+},$$

with analogous definitions for the remainder components of the vectors $s_-$ and $s_+$.

Within the CMT formalism, the outgoing wave amplitudes $s_-$ are the result both of the box's leakage and of the action of a scattering matrix C, which would describe the system if the resonances were turned off, to the incoming wave amplitudes $s_+$ $$s_- = Cs_+ + ud \quad (3)$$

where $d=(d_1,d_2)^T$ is a vector of coupling coefficients. Starting with the lossless case, the direct process is modeled by the interaction of light with a dielectric slab of index $n_{\mathit{eff}}$ (see FIG. 6B) between two semi-infinite media with indices $n_0$ and $n_2 (\in R)$. Thus in this model Eq. 3 is $$\begin{pmatrix} s_{1-} \\ s_{2-} \end{pmatrix} = \begin{pmatrix} r_{12} & t\sqrt{\frac{n_2}{n_0}} \\ t\sqrt{\frac{n_2}{n_0}} & r_{21} \end{pmatrix} \begin{pmatrix} s_{1+} \\ 0 \end{pmatrix} + u \begin{pmatrix} d_1 \\ d_2 \end{pmatrix} \quad (4)$$

where $r_{12}$ and t are the standard Fresnel coefficients for a field propagating towards the substrate and $r_{21}$ is the Fresnel reflection coefficient for a field propagating from the substrate.

Equation (4) shows clearly that the output of the optical system is the sum of a direct process (first product in the right-hand side) and a resonant process (second product in the right-hand side). Notice that $s_{2+}$ is zero since no light is coming from the substrate and that writing the scattering matrix in the above form fixes the reference planes (see FIGS. 6A-6C) to be the interfaces between the three media $(n_0/n_{\mathit{eff}}/n_2)$.

Coupled to (4), another equation is needed to describe the complex field inside the system $$\frac{du}{dt} = (i\omega_0 - \gamma_1 - \gamma_2)u + \kappa_1 s_{1+} \quad (5)$$

being $\gamma_1$ the leakage rate upwards, $\gamma_2$ the leakage rate into the substrate and $\gamma_1$ the coupling coefficient for $s_{1+}$ pumping the resonator. If the incoming wave amplitude has an harmonic time dependence also u will and $$\frac{d}{dt} \to i\omega;$$

therefore from (5) and (4) it is easy to retrieve the quantity $$\Gamma = \frac{s_{1-}}{s_{1+}} = r_{12} + \frac{d_1 \kappa_1}{i(\omega - \omega_0) + \gamma_1 + \gamma_2} \quad (6)$$

This last quantity is of great importance in our derivation since the reflectance of the whole system is $R=|\Gamma|^2$ as can be noted recalling the definitions of $s_-$ and $s_+$. Since the reflection itself is bound to be $R \leq 1$ it is quite intuitive that the coupling coefficients showing in the last equation cannot take arbitrary values. Indeed, these are constrained by the non-resonant pathway through properties that are a direct consequence of fundamental concepts such as energy conservation and time-reversal symmetry.

$$d^\dagger d = 2\gamma \quad (7)$$

$$\kappa = d \quad (8)$$

$$Cd^* = -d \quad (9)$$

where C is a generic scattering matrix describing the direct pathway and γ is the sum of the leakage rates into the ports. Using the latter properties and those applying to scattering matrices for lossless media (i.e. $C^\dagger C=\mathbb{I}$) it is possible to further refine the expression obtained for $d_1^2$ and to deduce an expression for $$\Gamma = r_{12} + \frac{d_1^2}{i(\omega - \omega_0) + \gamma_1 + \gamma_2} \quad (10)$$

$$d_1^2 = \frac{-(2\gamma_1)^2 e^{i\theta_{12}}}{\frac{1}{|r|}(\gamma_1 - \gamma_2) + |r|(\gamma_1 + \gamma_2) \pm \sqrt{\frac{1}{|r|^3}(\gamma_1 - \gamma_2)^2 + |r|^2(\gamma_1 + \gamma_2)^2 - 2(\gamma_1^2 + \gamma_2^2)}} \quad (11)$$

where $r_{12}=|r|e^{i\theta_{12}}$ was set. The quantity Γ is the sum of two terms $r_{12}$ is the Fresnel coefficient for a dielectric slab on a substrate and plays the role of the direct pathway mentioned earlier while the second term is due to the resonant behavior displayed by the structure of the current invention and hence is referred to as resonant pathway. Furthermore, the direct path itself contains the resonant path (Eq. 11) as a consequence of the constraints shown earlier.

So far, only the lossless case has been taken into account. Nonetheless, given that the metasurfaces are etched directly into silicon, internal absorption cannot be ignored. Here, internal loss is included only within the resonant pathway thus keeping the scattering matrix unitary. Of course, this is already an approximation to the original model. The addition of an extra loss rate $\gamma_0$ due to absorption in (5) would result in a new expression for $$\Gamma = r_{12} + \frac{d_1^2}{i(\omega - \omega_0) + \gamma_0 + \gamma_1 + \gamma_2} \quad (12)$$

Before moving on, it is useful to start grasping the meaning of the two pathways studying their behavior as a function of the parameters showing in (12).

Starting with $r_{12}$, the case for a nanowires array with periodicity p illuminated by a plane wave with E polarized across the wire at normal incidence is addressed. The dependence of $|r_{12}|^2$ on the wavelength and on the filling fraction has been already shown in FIG. 6B of the main text. On the other hand, if only the height of the nanowires (and consequently the thickness of the effective layer) is changed the amplitude of the oscillations in $|r_{12}|^2$ remains unchanged while the whole plot shifts to longer wavelength as the thickness increases. Again, from now on the direct pathway will also be referred to as Fabry-Perot background.

Considering now the resonant pathway, the functional form of the second term in (12) is very close to that of a Lorentzian. Keeping in mind the fact that Γ is the sum of two complex numbers, it is interesting to monitor both the phase and the amplitude of the Lorentzian. It is insightful to study the Lorentzian at ω=!0 given that the information on the Lorentzian amplitude and phase is already contained in one single frequency. Specifically, the Lorentzian at $\omega=\omega_0$ is a function of the leakage rate ratios $\alpha=\gamma_2/\gamma_1$ and $\beta=\gamma_0/\gamma_1$. In particular, β mainly defines the amplitude while α controls mainly the phase and in part also the amplitude. In short, the resonant pathway is a complicated (and complex) function of the leakage rates, the resonance frequency and the direct pathway but all in all is a Lorentzian with a certain phase offset, width and amplitude.

Figure 7A:
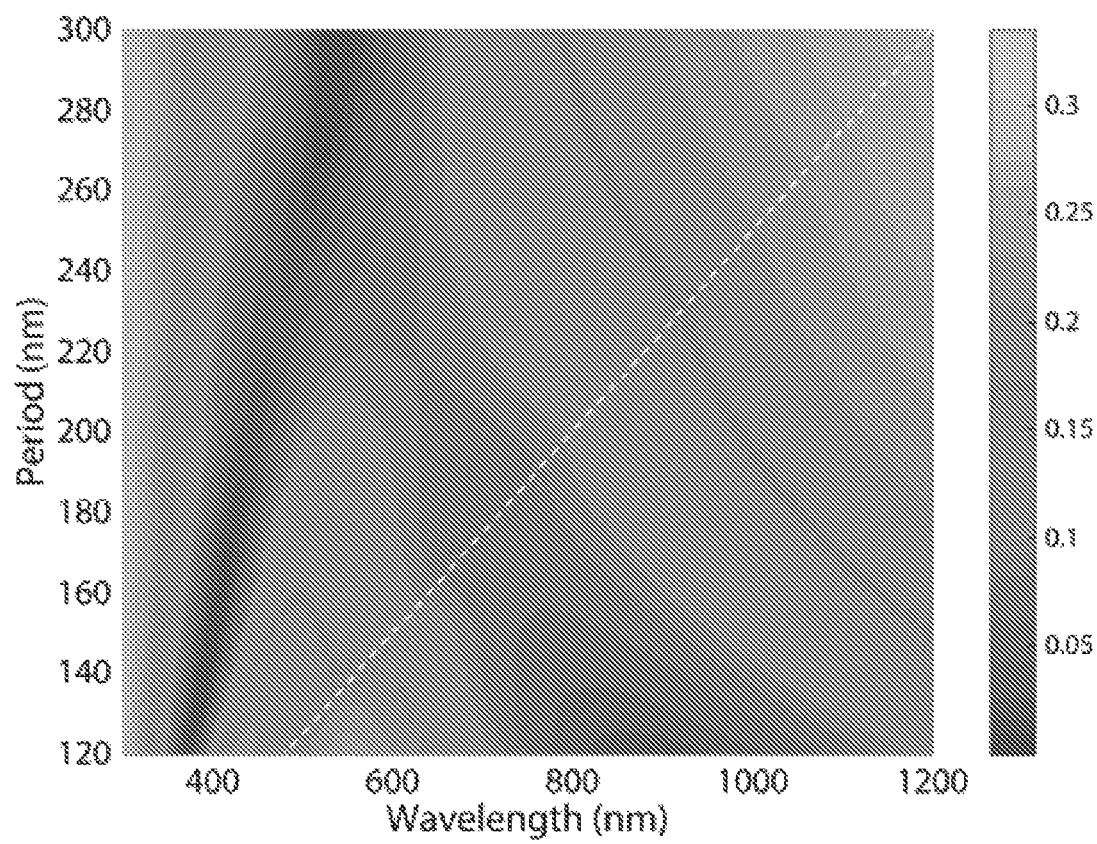
FIGS. 7A-7B show (7A) FDTD-simulated reflectance of an array of nanowires (individual wire 120 nm×80 nm) as p and λ change, where the dashed line remarks the onset of diffraction, (7B) Schematic of a m-ports coupled resonator, according to the current invention.

The main purpose of the theoretical derivation discussed so far is to find a relatively easy expression for the reflectance that can reproduce the spectra obtained by FDTD simulations. One might be tempted to use (12) however this is not possible due to the presence of diffraction within the substrate that confines its validity to the portion of FIG. 7A in which $\lambda > n_2 p$. Indeed, our arrays are surely sub-wavelength for visible light in the air side but the same does not hold for the substrate, especially if it is a high index dielectric as silicon. In other words the structure according to the current invention acts as an effective layer in reflection but as a grating in transmission as soon as $\lambda \leq n_2 p$.

Taking diffraction into account in the CMT formalism means adding a new port for every diffraction channel opened, which in turn means changing the dimension of the scattering matrix accordingly and adding the appropriate number of leakage rates. This is the reason why (12) cannot be used to fit the simulated reflectance colormap. First, the expression is so complicated due to the presence of $d_1$ that the fitting algorithm rarely converges. Further, since diffraction was not included in our derivation, even if the fit converged it would on a wrong $\gamma_2/\gamma_1$ ratio. Updating the model to an m-port configuration would not accomplish our goal of obtaining a simple model grasping the physical meaning of the spectra. If a perfect reflectance spectrum is needed then a simple FDTD simulation is ought to be run.

Figure 7B:
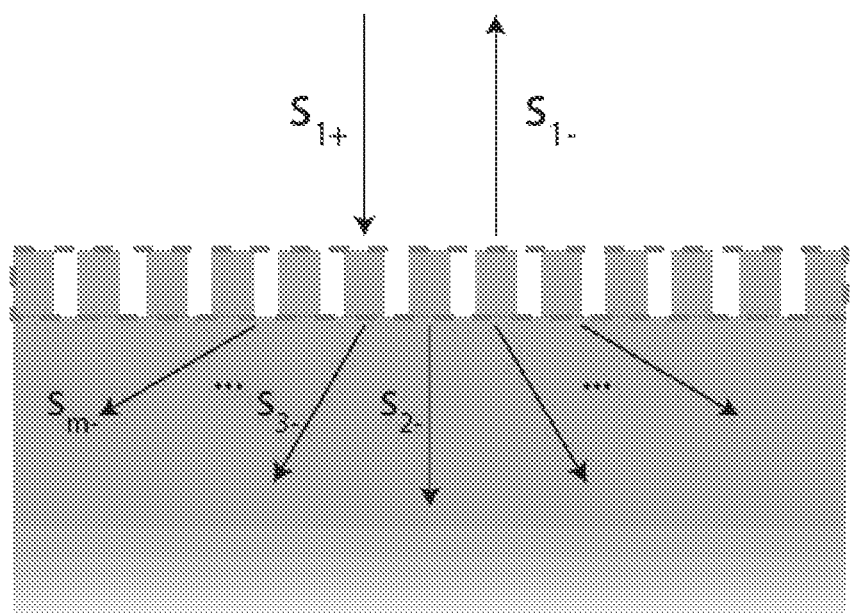

In search of a feasible approximation, it is useful to quickly go through the main points of the previous derivation trying to grasp the differences as the formalism is extended to m-ports (see FIG. 7 for the new scheme). The m-ports versions of (4) and (5) are respectively $$\begin{pmatrix} s_{1-} \\ s_{2-} \\ \vdots \\ s_{m-} \end{pmatrix} = \begin{pmatrix} C_{11} & C_{12} & \cdots & C_{1m} \\ C_{21} & C_{22} & \cdots & C_{2m} \\ \vdots & \vdots & \ddots & \vdots \\ C_{m1} & C_{m2} & \cdots & C_{mm} \end{pmatrix} \begin{pmatrix} s_{1+} \\ 0 \\ \vdots \\ 0 \end{pmatrix} + u \begin{pmatrix} d_1 \\ d_2 \\ \vdots \\ d_m \end{pmatrix} \quad (13)$$

$$\frac{du}{dt} = \left(i\omega_0 - \sum_i \gamma_i\right) u + d_1 s_{1+} \quad (12)$$

It is crucial to notice that even if extra channels in transmission are opened there is always one single channel in reflection. As a consequence, Γ is still defined as $s_{1-}/s_{1+}$ and its absolute square will still give the reflectance of the system. Following in our own footsteps $$\Gamma = \frac{s_{1-}}{s_{1+}} = C_{11} + \frac{d_1^2}{i(\omega - \omega_0) + \sum_i \gamma_i} \quad (15)$$

At this point two main routes opens up ahead: either one tries to give an expression to every matrix element and then embarks himself on solving $Cd^*=-d$ to find the new $d_1$ or tries to approximate the resonant and direct pathways showing in this last equation. Here the second choice has been preferred.

Starting from the resonant pathway and recalling the analysis of the previous section, it is conceivable to say that it is still basically a Lorentzian whose amplitude, width and phase are related to the direct path and to the leakage rates in a rather complicated manner. Regarding the direct path, it can be argued that light is still seeing an effective layer (there is no diffraction in air) but once diffraction channels are opened energy is redistributed to more ports resulting in a little decrease in reflection and in anomalies in the spectrum known as Rayleigh's anomalies. In any case, since the knowledge of $C_{11}$ is related to that of all the other elements (recall the S-matrix properties), here it is simply assumed that $r_{12}$ is still a feasible approximation even when diffraction is present. With all those assumptions, the expression used in the main text for the reflectance is $$R = \left| r_{12} + \frac{Ae^{i\phi}}{i(\omega - \omega_0) + \omega} \right|^2 \tag{16}$$

This section contains the derivation of the quantity $d_1^2$ for the case C $d^* = -d$ is $$\begin{pmatrix} r_{12} & t' \\ t' & r_{21} \end{pmatrix} \begin{pmatrix} d_1^* \\ d_2^* \end{pmatrix} = -\begin{pmatrix} d_1 \\ d_2 \end{pmatrix} \tag{17}$$

and performing the product the following expression for $d_1$ and $d_2$ are extracted $$d_1 = -(r_{12}d_1^* + t'd_2^*)$$

$$d_2 = -(t'd_1^* + r_{21}d_2^*)$$

Hence, using $d_1^* d_1 = \gamma_1$ $$d_2^* = -\frac{1}{t'}\left(\frac{2\gamma_1}{d_1^*} + r_{12}d_1^*\right)$$

Plugging the last two equations into $d_2^* d_2 = \gamma_2$ the following expressions are deduced $$2\gamma_2 = -\frac{1}{t'}\left(\frac{2\gamma_1}{d_1^*} + r_{12}d_1^*\right)\left[-t'd_1^* - r_{21}\left(-\frac{1}{t'}\left(\frac{2\gamma_1}{d_1^*} + r_{12}d_1^*\right)\right)\right] \tag{18}$$

$$2\gamma_2 t' = \left(2\gamma_1 t' + r_{12}t'd_1^{*2}\right) - \frac{r_{21}}{t'}\left(\frac{2\gamma_1}{d_1^*} + r_{12}d_1^*\right)^2$$

$$2\gamma_2 t'^2 = 2\gamma_1 t'^2 + r_{12}t'^2 d_1^{*2} - r_{21}\left(\frac{2\gamma_1}{d_1^*} + r_{12}d_1^*\right)^2$$

At this point the unitarity of the scattering matrix turns out to be useful to get rid of $t'^2$. Indeed, in the present case $C^\dagger C = \mathbb{I}$ implies $$\begin{cases} |r_{12}|^2 + |t'|^2 = 1 \\ |r_{21}|^2 + |t'|^2 = 1 \\ t' = -t'^* \frac{r_{21}}{r_{12}^*} \end{cases}$$

The first and the second conditions result in $|r_{12}|=|r_{21}|=|r|$. Also, multiplying the third condition by t' gives $$t'^2 = -|t'|^2 \frac{r_{21}}{r_{12}^*}$$

and since $r_{12}$ and $r_{21}$ have the same amplitude $r_{21}/r_{12}^* = e^{i(\theta_{12}+\theta_{21})}$ ($\theta_{12}$ and $\theta_{21}$ being the arguments of $r_{12}$ and $r_{21}$ respectively). Thus for $t'^2$ $$t'^2 = -(1-|r|^2)e^{i(\theta_{12}+\theta_{21})} \tag{19}$$

This substitution is a direct consequence of the constraints imposed by power conservation on the matrix elements of the scattering matrix. Performing this substitution in (18) gives $$-2\gamma_2(1 - |r|^2)e^{i(\theta_{12}+\theta_{21})} = -2\gamma_1(1 - |r|^2)e^{i(\theta_{12}+\theta_{21})} + \tag{20}$$

$$-|r|d_1^{*2}(1-|r|^2)e^{i(2\theta_{12}+\theta_{21})} - |r|e^{i\theta_{21}}\left(\frac{2\gamma_1}{d_1^*} + |r|e^{i\theta_{12}}d_1^*\right)^2$$

and after a few passages and trivial manipulations eventually results in the following bi-quadratic equation $$d_1^{*4} e^{i(2\theta_{12}+\theta_{21})} + d_1^{*2} e^{i(\theta_{12}+\theta_{21})}\left[\frac{1}{|r|}(\gamma_1 - \gamma_2) + |r|(\gamma_1 + \gamma_2)\right] + 4\gamma_1^2 e^{i\theta_{21}} = 0 \tag{21}$$

Such equations are easy to solve, since they reduce to a quadratic equation in the variable $x \equiv d_1^{*2}$ and hence can be solved for x using the usual quadratic formula $$x = \frac{b/2 \pm \sqrt{(b/2)^2 - ac}}{a}$$

$$x = -e^{i(\theta_{12})}.$$

$$\left\{\frac{1}{|r|}(\gamma_1 - \gamma_2) + |r|(\gamma_1 + \gamma_2) \mp \sqrt{\frac{1}{|r|^2}(\gamma_1 - \gamma_2)^2 + |r|^2(\gamma_1 + \gamma_2)^2 - 2(\gamma_1^2 + \gamma_2^2)}\right\}$$

Thus recovering back $d_1^2$ $$d_1^2 = \frac{-(2\gamma_1)^2 e^{i\theta_{12}}}{\frac{1}{|r|}(\gamma_1 - \gamma_2) + |r|(\gamma_1 + \gamma_2) \mp \sqrt{\frac{1}{|r|^2}(\gamma_1 - \gamma_2)^2 + |r|^2(\gamma_1 + \gamma_2)^2 - 2(\gamma_1^2 + \gamma_2^2)}} \tag{20}$$

which appears in the expression of Γ formerly shown $$\Gamma = r_{12} + \frac{d_1^2}{i(\omega - \omega_0) + \gamma_1 + \gamma_2}$$

Described herein is a design routine adopted to obtain the optimized geometries for the Si nanowires array presented in the main text (the case of nanopillars is analogous), according to embodiments of the current invention.

The first step of such optimization consists in exploring how the Mie resonances of a single scatterer are influenced by the geometry.

Figure 8A:
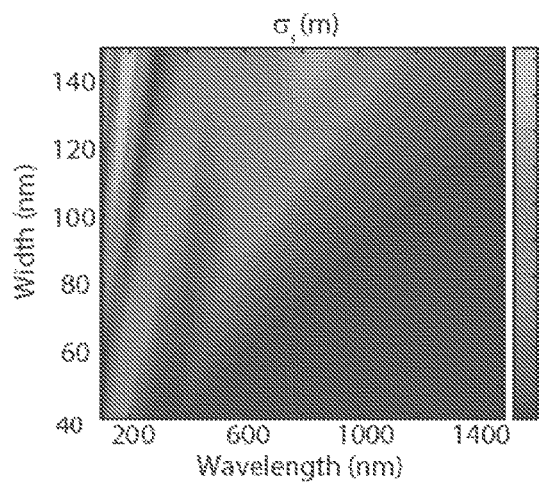
FIGS. 8A-8D show (8A) $C_s$ for a rectangular Si nanowire (3:2) as the width w and the wavelength are changed, (8B) $C_s$ for a rectangular Si nanowire of fixed width w=80 nm as the height h and the wavelength are changed, (8C) reflectance colormap for an array of Si nanowires with fixed width w=80 nm and fixed periodicity p=180 nm as the height of the wires is changed, (8D) simulated reflectance of an array of Si nanowires (individual wire 80 nm×120 nm) as p and change, where the substrate is Si, according to the current invention.

FIG. 8A shows the scattering cross section for a rectangular nanowire (ω×3/2ω) as the width ω and the wavelength are changed if incoming light is at normal incidence and with a polarization such that E is perpendicular to the wires. It is easy to notice that the first available mode lies in the visible spectrum if ω≲120 nm while higher order modes are excited at shorter wavelengths. Since, in the double-dip regime, the first dip is expected to lie at higher frequencies with respect to the mode frequency, the width chosen is ω=80 nm which has a resonance around λ≈570 nm.

Figure 8B:
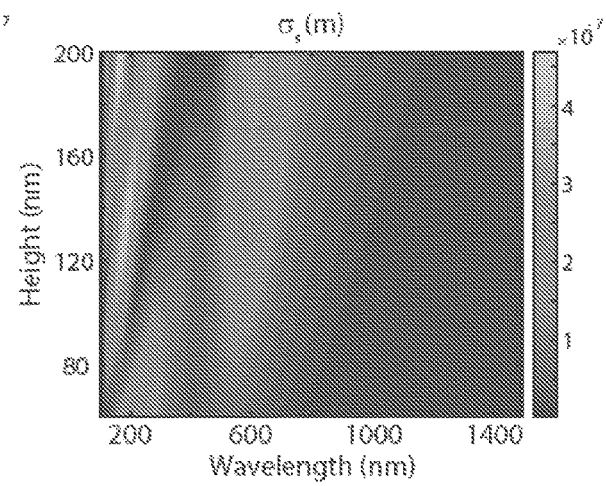

The choice of a rectangular nanowire (3:2) may seem quite random. Indeed, for the nanowire's fundamental mode the height is relevant only to some extent. To prove this, $\sigma_s$ for a single wire of fixed width w=80 nm has been calculated as its height is swept from 30 nm to 200 nm (see FIG. 8B). First of all, the resonance becomes very weak if h≲50 nm. Moreover, the change in height induces only a small shift of the resonance frequency which also tend to saturate above h≈170 nm. Inspection of the fields profiles allows labeling the mode as a Magnetic Dipole (MD) resonance.

Figure 8C:
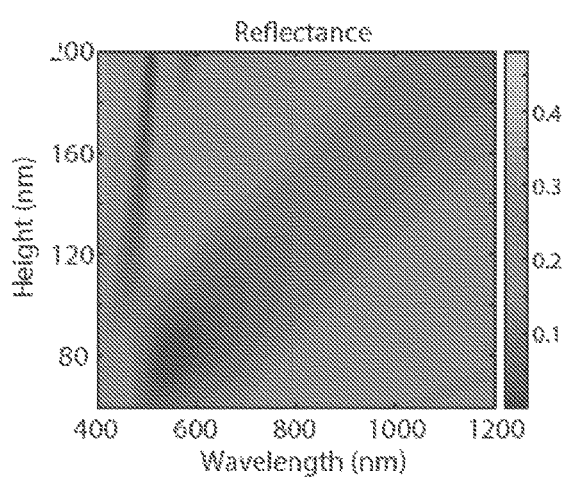

On the other hand, the nanowires' height defines the thickness of the effective layer and therefore influences the direct pathway. To have a physical intuition of this phenomenon, a reflectance colormap is calculated for an array of nanowires with fixed width w=80 nm and fixed periodicity p=180 nm (thus fixed nneff) as the height of the wires is changed (see FIG. 8C). Both the minima are shifting to longer wavelength as h increases but in particular the second. Basically the dashed line of FIG. 2A above is shifting to lower frequencies and this is in agreement with the fact that a thicker layer can fit longer wavelengths. Of course, this is just an intuitive explanation since the real situation is much more complicated and phase differences between the pathways should also be taken into account. Finally, the thickness chosen is 120 nm which corresponds to a dip around λ≈700 nm for this periodicity.

Figure 8D:
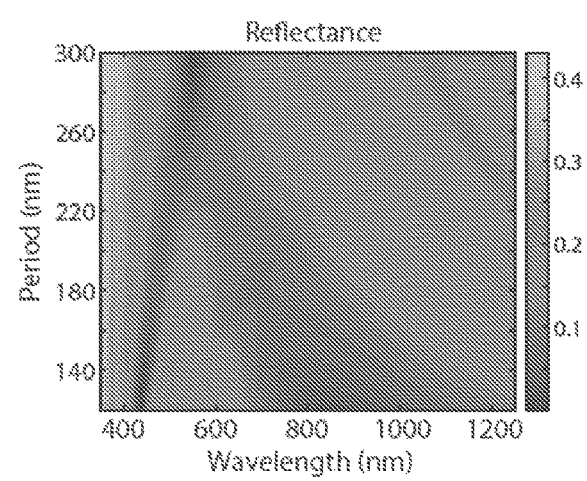

It is important to point out that and changing either the height or the width affects both the pathways although, as just shown, to some extent it is possible to choose h and w separately. FIG. 8D depicts the reflectance colormap of a Si nanowires array 80 nm×120 nm which is the final result of this "optimization procedure".

Figure 9A:
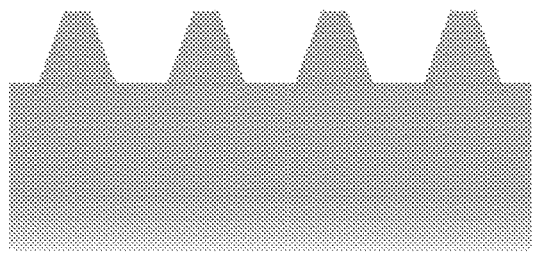
FIGS. 9A-9E show (9A-9C) slated nanowires-to-effective layers approximation for the direct pathway, (9D) simulated reflectance of 4 layers on a Si (non-dispersive model used in the main text) substrate as their effective indices are changed according to the approximation, (9E) shows some examples of the horizontal or vertical cross-sectional shapes of the nanostructures, according to embodiments of the current invention.
Figure 9B:
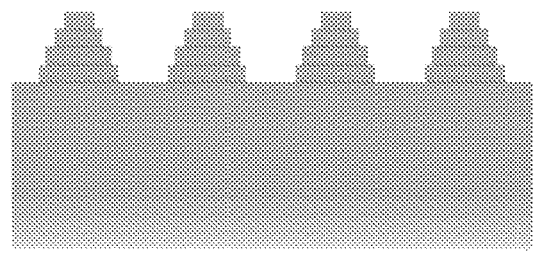
Figure 9C:
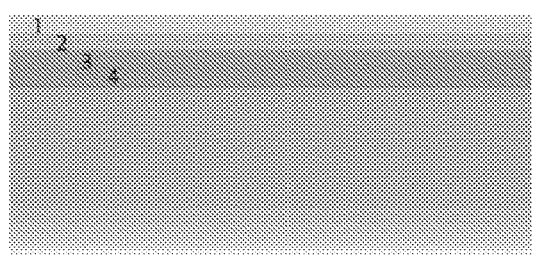
Figure 9D:
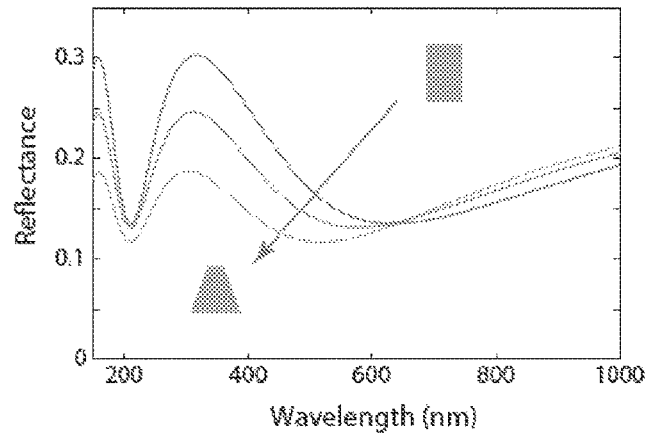
Figure 9E:
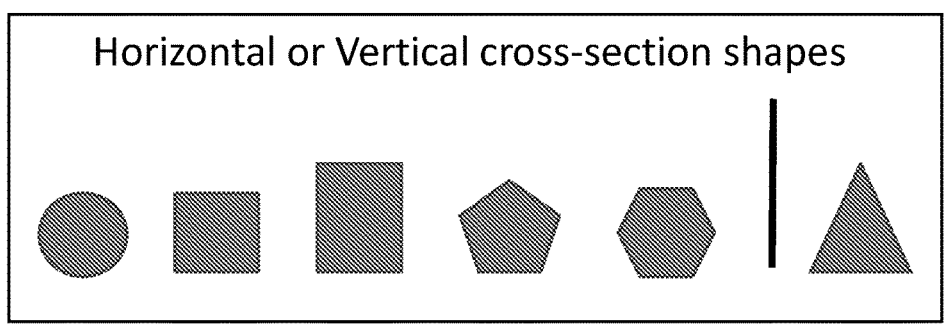

Regarding slanting, the consequences of slanted sidewalls on the resonant and on the direct path are isolated and analyzed. Concerning the direct pathway, the following approximation has been done to include the effects of slanting. The nanowires in FIG. 9A were approximated by a set of slabs of different width but same height resembling Mayan pyramids (FIG. 9B). Each level of the pyramids has a specific filling fraction (the periodicity is kept fixed at p=180 nm) and therefore is seen by incident light as an effective layer with a certain effective index given by Eq. (1) above). Thus the direct pathway of slanted nanowires is approximated by n effective layers and changing the angle of the sidewalls is accounted by changing the set of effective indices (FIG. 9C). As can be easily noticed by inspection of FIG. 9D the consequences of slanting are a blue-shift of the first Fabry-Pérot minimum and a general reduction in reflection. The reason behind this beneficial effect is that the abrupt discontinuity in the index is partially removed and, to some extent, a graded index AR coating in only 120 nm is generating the direct pathway. FIG. 9E shows some examples of horizontal or vertical cross-section shapes of the nanostructures, according to the current invention.

In another aspect of the invention, the nanoparticles have a vertical cross-sectional shape that can include triangular, circular, trapezoidal, hexagonal rectangular, and square. Here, an angle between a base of the trapezoid and a leg of the trapezoid are in a range of 90-75 degrees.

In a further aspect of the invention, the nanoparticles have a horizontal cross-sectional shape that can include square, rectangular, hexagonal, triangular, circular, and, trapedzoidal.

Figure 10A:
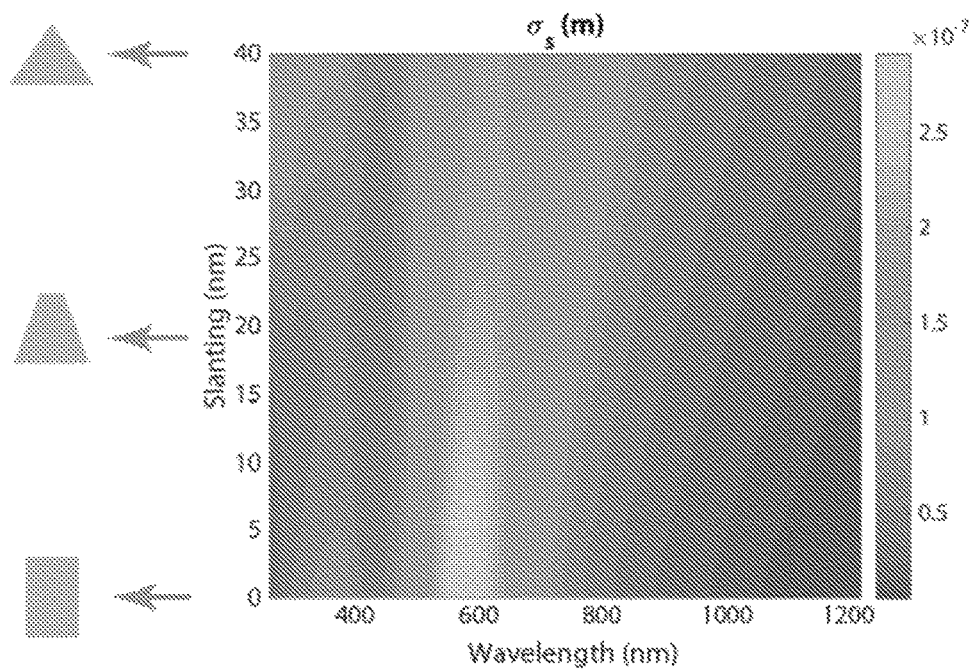
FIGS. 10A-10G show (10A) scattering cross section for a Si nanowire as λ and the sidewalls slanting are changed, (10B-10D) fields profiles (E field lines in gray and H filed intensity as a colormap) for the magnetic dipole resonance as the sidewalls slanting is changed, according to embodiments of the current invention.
Figure 10B:
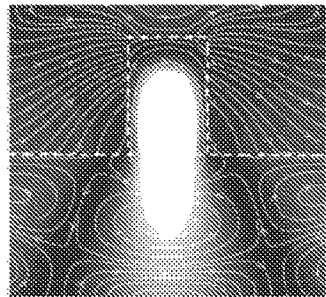
Figure 10C:
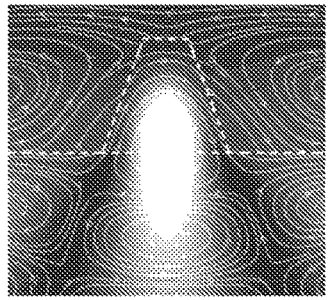
Figure 10D:
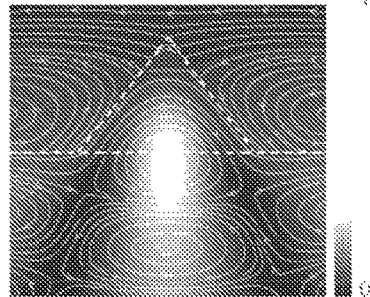
Figure 10E:
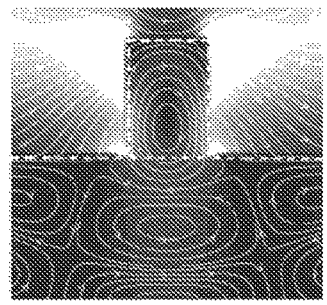
Figure 10F:
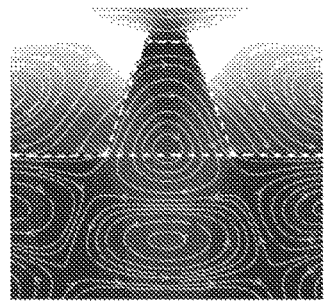
Figure 10G:
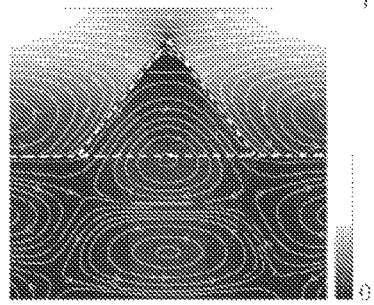

On the other hand, to study how the resonant pathway is affected, the scattering cross section $\sigma_s$ of a single wire is monitored. Changing the sidewalls slanting as described previously, the consequent variation in $\sigma_s$ is shown in the colormap in FIG. 10A. Peculiarly, the resonance broadens and red-shifts. To understand why this is happening also the fields profiles should be inspected (see FIGS. 10B-10G). Clearly, the characteristic displacement current loops of the MD mode are moving closer to the substrate as the sidewalls become tilted, this in turn means that the resonator is more coupled to the substrate and the leakage rate into it increases implying a broadening of the resonance. The same conclusion can be drawn by looking at the H field intensity colormap. In addition, the lateral dimension of the currents loops increases with slanted sidewalls thus the "effective resonator" is wider and its resonance frequency redshifts. At this point all the ingredients to give an intuitive interpretation of why the double dip merges into a broad single dip are available. Indeed, the resonant pathway is broadening and red-shifting while the direct pathway is blue-shifting and generally decreasing. Thus, intuitively the dashed lines of FIG. 1 above are getting closer as the tilting of the sidewalls is increasing. In addition, the average reflection is lower because both the scattering and the contribution from the direct pathway are less intense.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of fabricating a meta-surface antireflective coating, comprising forming on a substrate or in a film on said substrate, using a patterning method, a pattern of nanostructures, wherein said nanostructures comprise a pattern of nanowires or a pattern of nanoparticles, or said pattern nanowires and said pattern of nanoparticles, wherein said nanostructures are arranged to form a metasurface AR coating, wherein said metasurface AR coating reflects incident light in a double-dip reflectance according to a doubly-resonant arrangement of said metasurface AR coating, wherein said metasurface AR coating comprises a structure for a direct light pathway and a resonant light pathway.

2. The method according to claim 1, wherein said substrate is selected from the group consisting of Si, Ge, GaAs, copper indium gallium (di)selenide (CIGS), CdTe, InP, GaN, GaP, and, TiO$_2$.

3. The method according to claim 1, wherein said film on said substrate comprises dielectrics or semiconductors, wherein said dielectrics selected from the group consisting of silicon nitride, titanium dioxide, ITO, ZnO, SiO$_2$, and MgO, wherein said semiconductors are selected from the group consisting of Si, Ge, GaAs, copper indium gallium (di)selenide (CIGS), CdTe, InP, GaN, and, GaP.

4. The method according to claim 1, wherein said nanoparticles comprise a vertical cross-sectional shape selected from the group consisting of triangular, circular, trapezoidal, hexagonal rectangular, and square.

5. The method according to claim 4, wherein an angle between a base of said trapezoid and a leg of said trapezoid are in a range of 90-75 degrees.

6. The method according to claim 1, wherein said nanoparticles comprise a horizontal cross-sectional shape selected from the group consisting of, square, rectangular, hexagonal, triangular, circular, and, trapedzoidal.

7. The method according to claim 1, wherein a width of a nanostructure in said pattern of nanostructures is in a range of 40 nm to 200 nm.

8. The method according to claim 1, wherein a separation between adjacent said nanowires, said nanoparticles, or said nanowires and said nanoparticles is less than approximately $\lambda/2$ of a wavelength $\lambda$ of interest of said incident light.

9. The method according to claim 8, wherein said incident light comprises wavelengths in a range of 200 nm to 15 μm.

10. The method according to claim 1, wherein a plurality of said nanoparticles comprising different sizes and different shapes are interspersed on said substrate, wherein said interspersed nanoparticles are configured to add additional said doubly-resonances to said metasurface AR coating, wherein said doubly-resonances comprise combined Mie and Fabry-Pérot resonances, wherein a broadening of anti-reflection in said AR coating is enabled.

11. The method according to claim 1, wherein a height of a nanostructure in said nanostructure pattern is in a range of 60 nm to 200 nm.

12. The method according to claim 1, wherein a periodicity of nanostructure in said nanostructure pattern is in a range of 120 nm to 300 nm.

13. The method according to claim 1, wherein said patterning method comprises lithography, nanoimprint, or self-assembly.

14. The method according to claim 13, wherein said lithography method comprises UV lithography, e-beam lithography, and nanoimprint lithography.

15. The method according to claim 1, wherein said metasurface AR coating comprises an average reflectance as low as 3.9% over a wavelength range of 425 nm-900 nm.

* * * * *